US012809721B2

(12) United States Patent
Yang

(10) Patent No.: US 12,809,721 B2
(45) **Date of Patent: *Nov. 24, 2026**

(54) METHOD, MEMORY CONTROLLER, AND MEMORY SYSTEM FOR READING DATA STORED IN FLASH MEMORY

(71) Applicant: Silicon Motion, Inc., Hsinchu County (TW)

(72) Inventor: Tsung-Chieh Yang, Hsinchu City (TW)

(73) Assignee: Silicon Motion, Inc., Hsinchu County (TW)

( * ) Notice: Subject to any disclaimer, the term of this patent is extended or adjusted under 35 U.S.C. 154(b) by 42 days.

This patent is subject to a terminal disclaimer.

(21) Appl. No.: 18/926,329

(22) Filed: Oct. 25, 2024

(65) Prior Publication Data

US 2025/0045159 A1 Feb. 6, 2025

Related U.S. Application Data

(63) Continuation of application No. 18/379,154, filed on Oct. 11, 2023, now Pat. No. 12,164,377, which is a (Continued)

(30) Foreign Application Priority Data

Apr. 21, 2014 (TW) ................................ 103114417

(51) Int. Cl.

*G11C 29/00* (2006.01)
*G06F 11/10* (2006.01)
(Continued)

(52) U.S. Cl.

CPC ...... *G06F 11/1068* (2013.01); *G06F 11/1012* (2013.01); *G11C 11/5642* (2013.01);
(Continued)

(58) Field of Classification Search

CPC .. G06F 11/08; G06F 11/1068; G06F 11/1028; G11C 11/5642; G11C 16/26; G11C 29/52; G11C 29/12; H04M 13/1102
See application file for complete search history.

(56) References Cited

U.S. PATENT DOCUMENTS

| | | | |
|---|---|---|---|
| 6,081,453 | A | 6/2000 | Iwahashi |
| 6,751,766 | B2 | 6/2004 | Guterman et al. |

(Continued)

FOREIGN PATENT DOCUMENTS

| | | | |
|---|---|---|---|
| CN | 101252020 | A | 8/2008 |
| CN | 101517656 | A | 8/2009 |

(Continued)

OTHER PUBLICATIONS

Ielmini et al., "Recovery and Drift Dynamics of Resistance and Threshold Voltages in Phase-Change Memories", IEEE Transactions on Electron Devices, Feb. 2007, pp. 308-315, vol. 54, No. 2.

*Primary Examiner* — Esaw T Abraham
(74) *Attorney, Agent, or Firm* — Winston Hsu

(57) ABSTRACT

An exemplary method for reading data stored in a flash memory includes: selecting an initial gate voltage combination from a plurality of predetermined gate voltage combination options; controlling a plurality of memory units in the flash memory according to the initial gate voltage combination, and reading a plurality of bit sequences; performing a codeword error correction upon the plurality of bit sequences, and determining if the codeword error correction successful; if the codeword error correction is not successful, determining an electric charge distribution parameter; determining a target gate voltage combination corresponding to the electric charge distribution parameter by using a look-up table; and controlling the plurality of memory units
(Continued)

to read a plurality of updated bit sequences according to the target gate voltage combination.

6 Claims, 13 Drawing Sheets

Related U.S. Application Data continuation of application No. 17/991,799, filed on Nov. 21, 2022, now Pat. No. 11,822,428, which is a continuation of application No. 17/468,704, filed on Sep. 8, 2021, now Pat. No. 11,537,469, which is a continuation of application No. 16/787,038, filed on Feb. 11, 2020, now Pat. No. 11,144,390, which is a continuation of application No. 15/927,069, filed on Mar. 20, 2018, now Pat. No. 10,599,516, which is a continuation of application No. 15/423,593, filed on Feb. 3, 2017, now Pat. No. 9,959,165, which is a continuation of application No. 14/666,316, filed on Mar. 24, 2015, now Pat. No. 9,601,219.

(51) Int. Cl.

*G11C 11/56* (2006.01)
*G11C 16/26* (2006.01)
*G11C 29/02* (2006.01)
*G11C 29/52* (2006.01)
*H03M 13/11* (2006.01)
*G11C 29/04* (2006.01)

(52) U.S. Cl.

CPC ............ *G11C 16/26* (2013.01); *G11C 29/028* (2013.01); *G11C 29/52* (2013.01); *H03M 13/1102* (2013.01); *G11C 2029/0411* (2013.01)

(56) References Cited

U.S. PATENT DOCUMENTS

| | | | | |
|---|---|---|---|---|
| 7,263,006 | B2 | 8/2007 | Aritome | |
| 7,966,546 | B2 | 6/2011 | Mokhlesi | |
| 8,059,474 | B2 | 11/2011 | Aritome | |
| 8,225,181 | B2 | 7/2012 | Perlmutter | |
| 8,321,760 | B2 | 11/2012 | Son et al. | |
| 8,892,966 | B2 | 11/2014 | Haratsch et al. | |
| 8,930,647 | B1 | 1/2015 | Smith | |
| 9,021,331 | B2 * | 4/2015 | Wu | G06F 11/1068 714/759 |
| 9,058,289 | B2 * | 6/2015 | Tai | G11C 16/26 |
| 9,069,688 | B2 | 6/2015 | Chung | |
| 9,244,763 | B1 | 1/2016 | Kankani | |
| 9,348,959 | B1 | 5/2016 | Tuan | |
| 9,367,389 | B2 * | 6/2016 | Alhussien | H03M 13/458 |
| 2007/0014160 | A1 | 1/2007 | Kobernik | |
| 2008/0056044 | A1 | 3/2008 | Tomita | |
| 2008/0077348 | A1 | 3/2008 | Hildebrand | |
| 2009/0089604 | A1 | 4/2009 | Malik | |
| 2009/0310404 | A1 | 12/2009 | Cho | |
| 2010/0053131 | A1 | 3/2010 | Handa | |
| 2010/0103731 | A1 | 4/2010 | Yoo | |
| 2010/0180073 | A1 | 7/2010 | Weingarten | |
| 2010/0223530 | A1 | 9/2010 | Son | |
| 2011/0044101 | A1 | 2/2011 | Chou | |
| 2011/0258371 | A1 | 10/2011 | Yang | |
| 2012/0008386 | A1 | 1/2012 | Chilappagari | |
| 2012/0140560 | A1 | 6/2012 | Yang | |
| 2012/0203951 | A1 | 8/2012 | Wood | |
| 2012/0213001 | A1 | 8/2012 | Yang | |
| 2012/0224420 | A1 | 9/2012 | Sakurada | |
| 2012/0294104 | A1 | 11/2012 | Mun | |
| 2013/0132652 | A1 | 5/2013 | Wood | |
| 2013/0148435 | A1 | 6/2013 | Matsunaga | |
| 2013/0163330 | A1 | 6/2013 | Sharon | |
| 2013/0176779 | A1 | 7/2013 | Chen | |
| 2013/0215682 | A1 | 8/2013 | Yang | |
| 2013/0343131 | A1 | 12/2013 | Wu | |
| 2014/0040704 | A1 | 2/2014 | Wu | |
| 2014/0059396 | A1 | 2/2014 | Matsuyama | |
| 2014/0092682 | A1 | 4/2014 | Yu | |
| 2014/0125131 | A1 | 5/2014 | Lalitnuntikul | |
| 2014/0229131 | A1 | 8/2014 | Cohen | |
| 2014/0258590 | A1 | 9/2014 | Kochar | |
| 2014/0281772 | A1 | 9/2014 | Jeon | |
| 2014/0329339 | A1 | 11/2014 | Chaji | |
| 2015/0055411 | A1 | 2/2015 | Kim | |
| 2015/0085571 | A1 | 3/2015 | Hu | |
| 2015/0127883 | A1 | 5/2015 | Chen | |
| 2015/0193302 | A1 | 7/2015 | Hyun | |
| 2015/0262694 | A1 | 9/2015 | Seo | |
| 2016/0080004 | A1 | 3/2016 | Yamaki | |
| 2017/0206979 | A1 | 7/2017 | Cohen | |

FOREIGN PATENT DOCUMENTS

| | | | |
|---|---|---|---|
| CN | 101536108 | A | 9/2009 |
| CN | 102024496 | A | 4/2011 |
| CN | 102171767 | A | 8/2011 |
| CN | 102568593 | A | 7/2012 |
| CN | 103208306 | A | 7/2013 |
| KR | 10-2005-0027216 | A | 3/2005 |
| KR | 10-2009-0088851 | A | 8/2009 |
| KR | 10-2010-0097961 | A | 9/2010 |
| KR | 10-2011-0061650 | A | 6/2011 |
| TW | I353521 | | 12/2011 |
| TW | 201230048 | | 7/2012 |
| WO | 2008/039692 | | 4/2008 |

* cited by examiner

METHOD, MEMORY CONTROLLER, AND MEMORY SYSTEM FOR READING DATA STORED IN FLASH MEMORY

CROSS REFERENCE TO RELATED APPLICATIONS

This application is a continuation application of U.S. application Ser. No. 18/379,154, filed on Oct. 11, 2023, now U.S. Pat. No. 12,164,377, issued on 2024 Dec. 10, which is a continuation application of U.S. application Ser. No. 17/991,799, filed on Nov. 21, 2022, which is a continuation application of U.S. application Ser. No. 17/468,704, filed on Sep. 8, 2021, which is a continuation application of U.S. application Ser. No. 16/787,038, filed on Feb. 11, 2020, which is a continuation application of U.S. application Ser. No. 15/927,069, filed on Mar. 20, 2018, which is a continuation application of U.S. application Ser. No. 15/423,593, filed on Feb. 3, 2017, which is a continuation application of U.S. application Ser. No. 14/666,316, filed on Mar. 24, 2015. The contents of these applications are incorporated herein by reference.

BACKGROUND OF THE INVENTION

1. Field of the Invention

The present invention relates to reading data stored in a flash memory, and more particularly, to a method and a memory controller for identifying an electric charge distribution parameter of memory units of a flash memory, to read data stored in the flash memory.

2. Description of the Prior Art

Flash memories may store data through electrically erasing and writing/programming, and may be widely applied to memory cards, solid state drives (SSDs) and portable multimedia players. Since flash memories are non-volatile memories, the data stored therein is reserved without supplying power. Further, flash memories may provide fast data reading rate and good anti-shock ability. The above properties explain why flash memories are popular.

Flash memories may be divided into NOR flash memories and NAND flash memories. NAND flash memories have advantages of reduced erasing/writing time, and each memory unit of a NAND flash memory requires a smaller chip area. Hence, compared with NOR flash memories, NAND flash memories have higher storage density and lower cost for each storage bit. In general, a flash memory stores data with memory unit arrays, and may be implemented with a floating-gate transistor. Through properly controlling the number of electric charges on the floating-gate of the floating-gate transistor, each memory unit may set a threshold voltage required for the memory unit implemented by the floating-gate transistor, in order to one bit (1-bit) or multiple bits information. In this way, when there is one or multiple predetermined control gate voltages exerted on the control gate of a floating-gate transistor, the on state of the floating-gate transistor will indicate one or multiple binary digits stored in the floating-gate transistor.

However, due to some factors, the number of charges originally stored in the flash memory unit may be affected/disturbed. For example, disturbances existed in the flash memory may be generated form write/program disturbances, read disturbances and/or retention disturbances. Take a NAND flash memory having memory units each storing multiple bits information as example, a physical page corresponds to multiple logic pages, and one or multiple control gate voltages are used to perform reading operations. For example, regarding a flash memory unit arranged for storing 3 bits information, the flash memory unit has one of 8 states (i.e. electric charge levels) corresponding to different electric charge numbers (e.g., different threshold voltages). However, since the program/erase (P/E) count and/or the data retention time changes, the threshold voltage distributions of the memory units in the flash memory unit will change accordingly. Hence, the information stored in the memory units may not be correctly obtained by using the original setting of controlling the gate voltage (e.g., the threshold voltage setting) to read the information stored in the memory units.

SUMMARY OF THE INVENTION

Hence, one of the objectives of the present invention is to provide a method and a memory controller arranged for determining an electric charge distribution parameter of memory units of a flash memory, to read the data stored in the flash memory, so as to solve the aforementioned problems.

An embodiment of the present invention provides a memory controller for reading data stored in a flash memory. The memory controller comprises a control logic circuit, a receiving circuit, a data processing circuit, and a storage unit. The control logic circuit is arranged to select an initial gate voltage combination from a plurality of predetermined gate voltage combination options, and control a plurality of memory units in the flash memory according to the initial gate voltage combination. The receiving circuit is coupled to the control logic circuit, and is arranged to read a plurality of bit sequences when the control logic circuit controls the plurality of memory units in the flash memory according to the initial gate voltage combination. The data processing circuit is coupled to the receiving circuit and the control logic circuit. The data processing circuit is arranged to perform a codeword error correction upon the plurality of bit sequences and determine whether the codeword error correction performed upon the plurality of bit sequences is successful. When the codeword error correction performed upon the plurality of bit sequences is not successful, the data processing circuit determines an electric charge distribution parameter corresponding to the initial gate voltage combination. The storage unit is coupled to the data processing circuit and the control logic circuit, and is arranged to store a look-up table (LUT). The control logic circuit further determines a target gate voltage combination corresponding to the electric charge distribution parameter by using the LUT, and controls the plurality of memory units to read a plurality of updated bit sequences according to the target gate voltage combination. The target gate voltage combination comprises a plurality of threshold voltage levels.

The embodiments provided by the present invention determine an electric charge distribution parameter in the flash memory which is going to be read, and then directly utilize a look-up table to find a target gate voltage combination corresponding to the electric charge distribution parameter, to control the flash memory. In this way, when the codeword error correction operation is not successful, the memory controller of the present invention may obtain a correct gate voltage combination more quickly to control the flash memory, without the need of wasting time on individually testing each of the predetermined gate voltage combinations to find the correct gate voltage combination.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

A general concept of the present invention is to control a flash memory to perform a plurality of times of reading operations upon each of a plurality of memory units in the flash memory (please note that the plurality of times of reading operations may apply different control gate voltage settings, respectively, to read a plurality of bits having a predetermined bit order from each memory unit as a bit sequence), read a plurality of bit sequences from the plurality of memory units, determine an electric charge scattering/distribution property in the plurality of memory units, determine a target gate voltage combination according to the electric charge scattering/distribution property and a plurality of predetermined gate voltage combination options, and control the plurality of memory units according to the target gate voltage combination to read a plurality of updated bit sequences and utilize the plurality of updated bit sequences to determine readout information of the plurality of memory units. Detailed descriptions are as follows.

Please note that, the threshold voltage distributions depicted in the figures of the present invention and voltage values of the control gate voltages mentioned in the following paragraphs are merely for illustrated purposes, and not meant to be limitations of the present invention. Besides, for brevity, the operation of reading multiple bits stored in the memory unit in the physical page of the NAND flash memory is merely an example for illustrating the technical features of the present invention. The flash memory may be a NAND flash memory or another type flash memory (e.g., a NOR flash memory). As long as the readout information of the memory unit is determined by the binary digit distribution property of the bit sequence read from the memory unit, the spirit of the present invention is met.

Figure 1:
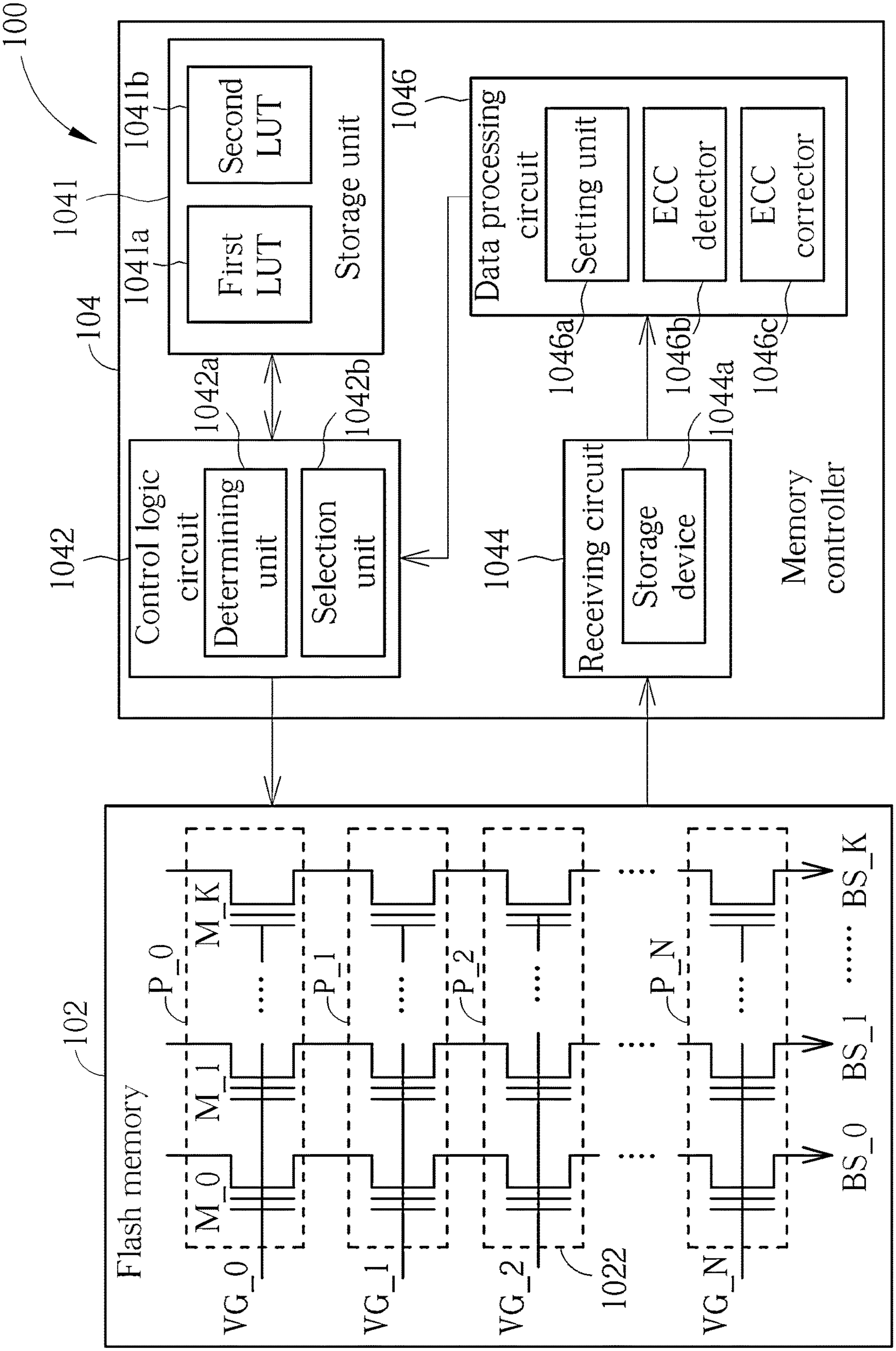
FIG. 1 is a diagram illustrating a memory system according to a first embodiment of the present invention.

Please refer to FIG. 1, which is a diagram illustrating a memory system 100 according to a first embodiment of the present invention. The memory system 100 includes a flash memory 102 and a memory controller 104. In this embodiment, the flash memory 102 may be a NAND flash memory including a plurality of physical pages P_0, P_1, P_2, . . . , P_N, wherein each of the physical pages P_0-P_N includes a plurality of memory units (e.g. floating gate transistors) 1022. Each of the plurality of memory units 1022 is a multilevel cell (MLC). For example, the target physical page P_0 which is going to be read includes memory units M_0-M_K. To read data stored in the memory units M_0-M_K of the target physical page P_0, the control gate voltages VG_0-VG_N should be properly set. For example, the control gate voltages V_0-VG_N should be properly set to ensure that all the memory units (e.g., floating gate memories) 1022 in the physical pages P_1-P_N are arranged in a proper state. If each of the memory units 1022 is used to store N bits (e.g., three bits including the least significant bit (LSB), the central significant bit (CSB) and the most significant bit (MSB)), the flash memory 102 may sequentially set the control gate voltage VG_0 by $(2^N-1)$ voltage levels, so as to identify the N bits of each memory unit 1022 in the physical page P_0.

Figure 2:
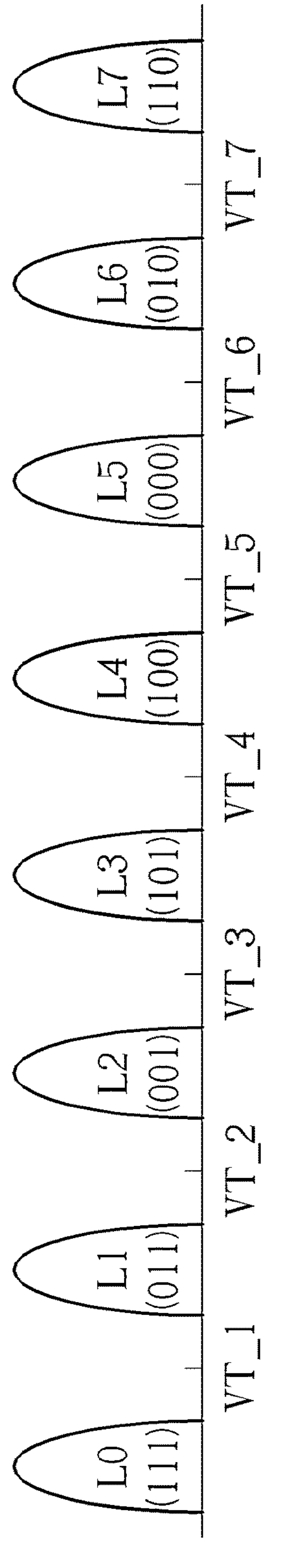
FIG. 2 is a diagram illustrating a first type threshold voltage distribution of a physical page.

Please refer to FIG. 2, which is a diagram illustrating a first type threshold voltage distribution of the physical page P_0 which is going to be read. The memory units M_0-M_K of the physical page P_0 may include memory units each having a floating gate programmed to have an electric charge level L0 (i.e., (MSB, CSB, LSB)=(1, 1, 1)), memory units each having a floating gate programmed to have an electric charge level L1 (i.e., (MSB, CSB, LSB)=(0, 1, 1)), memory units each having a floating gate programmed to have an electric charge level L2 (i.e., (MSB, CSB, LSB)=(0, 0, 1)), memory units each having a floating gate programmed to have an electric charge level L3 (i.e., (MSB, CSB, LSB)=(1, 0, 1)), memory units each having a floating gate programmed to have an electric charge level L4 (i.e., (MSB, CSB, LSB)=(1, 0, 0)), memory units each having a floating gate programmed to have an electric charge level L5 (i.e., (MSB, CSB, LSB)=(0, 0, 0)), memory units each having a floating gate programmed to have an electric charge level L6 (i.e., (MSB, CSB, LSB)=(0, 1, 0)), and memory units each having a floating gate programmed to have an electric charge level L7 (i.e., (MSB, CSB, LSB)=(1, 1, 0)).

In order to identify the LSBs of the memory units M_0-M_K, the flash memory 102 will set the control gate voltage VG_0 as the threshold voltage VT_4 shown in FIG. 2. Then, the on/off state of each memory unit in the physical page P_0 will indicate that the LSB of the memory unit is either "0" or "1". In this embodiment, when a memory unit in the physical page P_0 is turned on by the threshold voltage VT_4 applied to the control gate of memory unit, the flash memory 102 will output the binary digit "1" that represents the LSB; otherwise, the flash memory 102 will output the binary digit "0" that represents the LSB.

In order to identify CSBs of the memory units M_0-M_K, the flash memory 102 will set the control gate voltage VG_0 as the threshold voltages VT_2 and VT_6 shown in FIG. 2, respectively. Similarly, the on/off state of each memory unit in the physical page P_0 will indicate that the CSB of the memory unit is either "0" or "1". In this embodiment, when a memory unit in the physical page P_0 is turned on by both of the threshold voltages VT_2 and VT_6 applied to the control gate of the memory unit, the flash memory 102 will output the binary digit "1" that represents the CSB; when the memory unit in the physical page P_0 is turned on by the threshold voltage VT_6 but not turned on by the threshold voltage VT_2, the flash memory 102 will output the binary digit "0" that represents the CSB; and when the memory unit in the physical page P_0 is not turned on by the threshold voltages VT_2 and VT_6 applied to the control gate of memory unit, the flash memory 102 will output the binary digit "1" that represents the CSB.

In order to identify MSBs of the memory units M_0-M_K, the flash memory 102 will set the control gate voltage VG_0 as the threshold voltages VG_1, VG_3, VG_5 and VG_7 shown in FIG. 2, respectively. Similarly, the on/off state of each memory unit in the physical page P_0 will indicate that the MSB of the memory unit is either "0" or "1". In this embodiment, when a memory unit in the physical page P_0 is turned on by all of the threshold voltages VG_1, VG_3, VG_5 and VG_7 applied to the control gate of the memory unit, the flash memory 102 will output the binary digit "1" that represents the MSB; when the memory unit in the physical page P_0 is turned on by the threshold voltages VG_3, VG_5 and VG_7 applied to the control gate of memory unit but not turned on by the threshold voltage VT_1, the flash memory 102 will output the binary digit "0" that represents the MSB; when the memory unit in the physical page P_0 is turned on by the threshold voltages VG_5 and VG_7 applied to the control gate of memory unit but not turned on by the threshold voltages VT_1 and VT_3, the flash memory 102 will output the binary digit "1" that represents the MSB; when the memory unit in the physical page P_0 is turned on by the threshold voltage VG_7 applied to the control gate of memory unit but not turned on by the threshold voltages VT_1, VT_3 and VT_5, the flash memory 102 will output the binary digit "0" that represents the MSB; and when the memory unit in the physical page P_0 is not turned on all of the threshold voltages VT_1, VT_3, VT_5 and VT_7, the flash memory 102 will output the binary digit "1" that represents the MSB.

Figure 3:
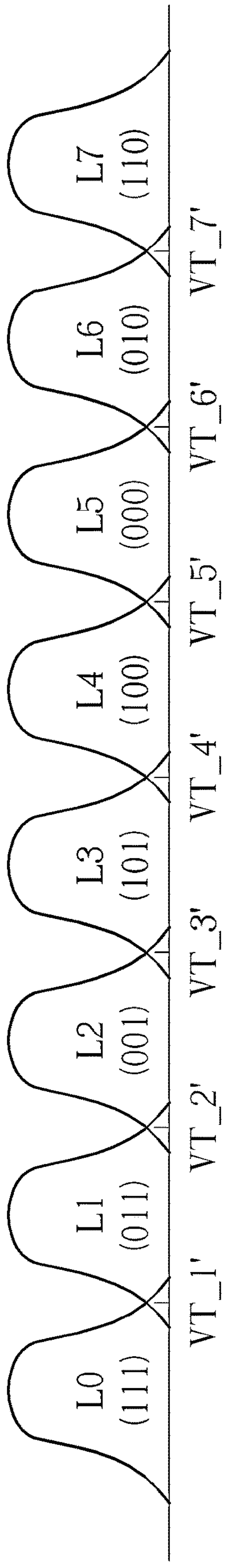
FIG. 3 is a diagram illustrating a second type threshold voltage distribution of a physical page.

However, the threshold voltage distribution shown in FIG. 2 may be changed to another threshold voltage distribution due to some factors, such as the increase of the program/erase/read count and/or data retention time. For example, the bell-shaped distributions respectively corresponding to the electric charge levels shown in FIG. 2 may become wider or be shifted. Please refer to FIG. 3, which is a diagram illustrating a second type threshold voltage distribution of the physical page P_0 which is going to be read. As can be seen from FIG. 3, the threshold voltage distribution shown in FIG. 3 is different from that shown in FIG. 2. Hence, if the control gate voltage VG_0 is set as the aforementioned threshold voltages VT_1-VT_7, the LSBs, CSBs and MSBs of the memory units M_0-M_K of the physical page P_0 may not be correctly obtained. More specifically, if the memory units M_0-M_K have threshold voltage distribution as shown in FIG. 3, new threshold voltages VT_1'-VT_7' should be applied to correctly obtain the stored information; otherwise, the codeword error correction (ECC) operation performed upon the codeword read from the memory units M_0-M_K (i.e., the codeword error correction operation) will not be successful due to the uncorrectable errors in the codewords. The codeword error correction operation of the codeword is performed by a data processing circuit 1046 in the memory controller 104. In general, the memory controller 104 further includes a storage unit 1041 arranged for storing a first look-up table (LUT) 1041*a*. The first look-up table 1041*a* is used to record a plurality of predetermined threshold voltages [VT1_1:VT1_7]-[VTM_1:VTM_7] corresponding to a plurality of different predetermined gate voltage combination options OP_1-OP_M (e.g., the first predetermined gate voltage combination option OP_1 is the aforementioned control gate voltage VG_0), respectively. That is, each predetermined gate voltage combination option includes 7 (i.e., $2^N-1$) threshold voltage levels as shown in FIG. 4.

Figure 4:
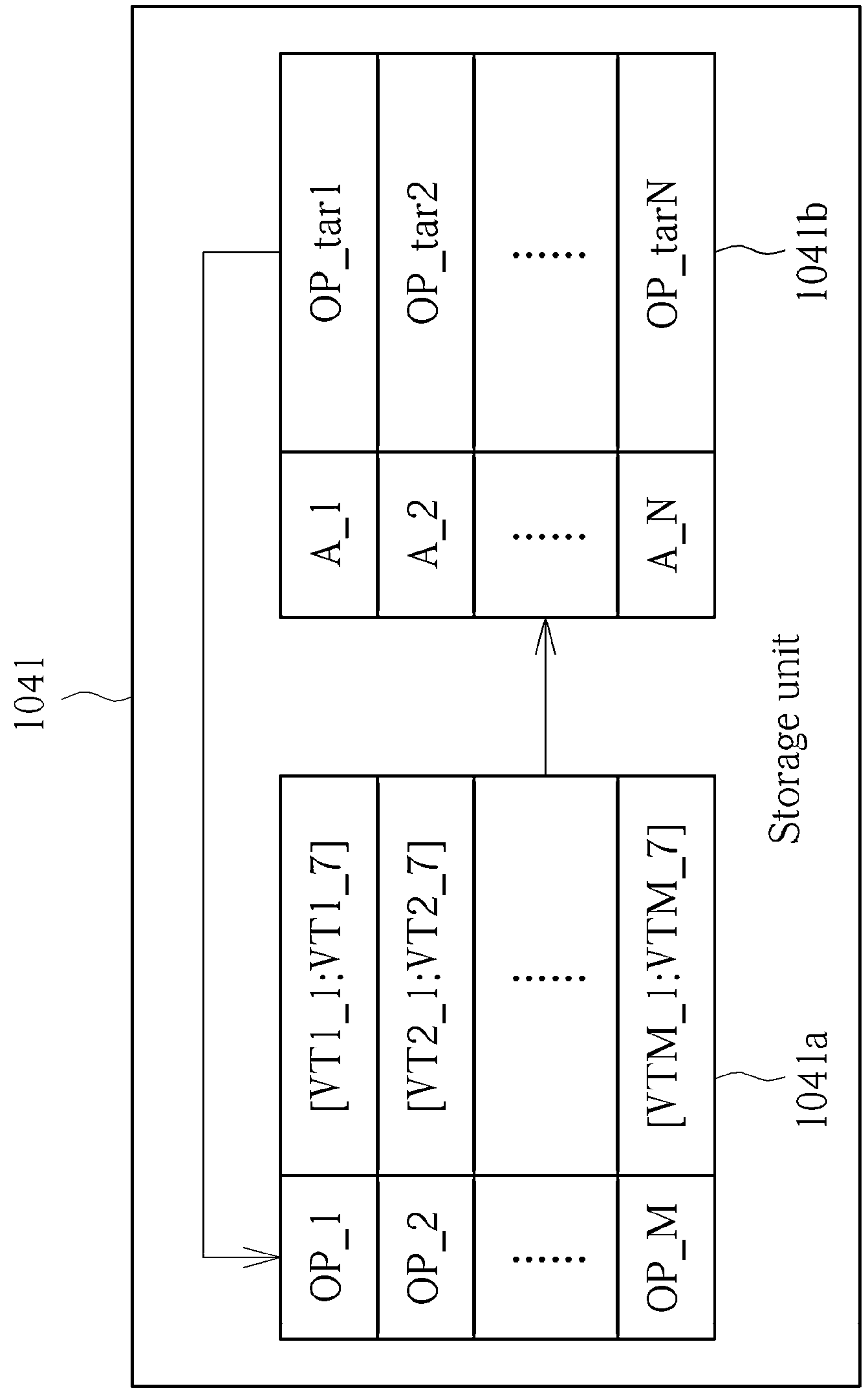
FIG. 4 is a diagram illustrating a storage unit according to an embodiment of the present invention.

FIG. 4 is a diagram illustrating a storage unit 1041 according to an embodiment of the present invention. The memory controller 104 sequentially selects each of the predetermined gate voltage combination options OP_1-OP_M, and exerts them on the memory units M_0-M_K, in order to obtain the information stored in the memory units M_0-M_K. Meanwhile, the data processing circuit 1046 in the memory controller 104 performs an error correction upon a codeword read from each predetermined gate voltage combination option, to determine whether the predetermined gate voltage combination option fails to work successfully due to uncorrectable errors in the codeword. Then, the memory controller 104 selects a predetermined gate voltage combination option from the plurality of predetermined gate voltage combination options OP_1-OP_M. This selected predetermined gate voltage combination option makes the error correction able to entirely correct all errors in the read codeword. However, individually exerting each of the predetermined gate voltage combination option OP_1-OP_M on the memory units M_0-M_K takes more time to determine a final predetermined gate voltage combination option. Hence, in this embodiment, the memory controller 104 is designed to adaptively track an electric charge distribution parameter in the memory units M_0-M_K, to determine a target gate voltage combination OP_T according to the electric charge distribution parameter and a plurality of gate voltage combination options OP_1-OP_M to thereby determine a target gate voltage combination OP_T to control the memory units M_0-M_K, and store the electric charge distribution parameter and the corresponding target voltage combination OP_T in a look-up table (LUT), thus reading the plurality of updated bit sequences (i.e., the information stored in the memory unit s M_0-M_K) faster, and reducing or eliminating uncorrectable errors existing in the code-words read form the memory units M_0-M_K.

Please refer to FIG. 1 again. The memory controller 104 is used to control the access (read/write) of the flash memory 102, and includes (but is not limited to) a storage unit 1041, a control logic circuit 1042, a receiving circuit 1044 and a data processing circuit 1046. The storage unit 1041 stores the first LUT 1041*a* and a second LUT 1041*b*. The control logic circuit 1042 includes a determining unit 1042*a* and a selection unit 1042*b*. The data processing circuit 1046 includes a setting unit 1046*a*. Please note that, FIG. 1 only shows elements pertinent to the technical features of the present invention. That is, the memory controller 104 may comprise additional elements for supporting other functions. Further, the storage unit 1041 may be configured in a memory outside or inside the control logic circuit 1042. In general, when receiving a read request corresponding to the data stored in the memory units M_0-M_K in the target physical page P_0, the control logic circuit 1042 will control the flash memory 102 to read the requested data in response to the read request. Then, when the flash memory 102 successfully recognizes all bits stored in each of the memory units M_0-M_K, the readout information having the recognized bits of the memory units M_0-M_K will be received by the receiving circuit 1044. As shown in FIG. 1, the receiving circuit 1044 has a storage device (e.g., a memory device) 1044*a*, which is used as a data buffer arranged for temporarily storing the readout information generated by the flash memory 102. As known by one skilled in the art, part of memory units in a physical page are used to store the error correction information (e.g., an ECC code). Hence, the data processing circuit 1046 is used to perform an error correction corresponding to the readout information (e.g., a codeword) read from a physical page. In this embodiment, the data processing circuit 1046 (e.g., an error correction circuit) further includes an error correction detector (ECC detector) 1046*b* and an error correction corrector (ECC corrector) 1046*c*. The ECC detector 1046*b* is used to examine the correctness of the readout information, so as to detect the existence of error bit(s). When the ECC corrector 1046*c* is informed by the ECC detector 1046*b*, the ECC corrector 1046*c* will correct error bit(s) found in the examined readout information. However, when the number of error bits actually existing in the readout information exceeds the largest number of error bits correctable by the ECC corrector 1046*c*, the ECC corrector 1046*c* will indicate that the readout information has uncorrectable errors. Hence, the control logic circuit 1042 will enable the proposed threshold voltage distribution tracking mechanism, to determine the readout information capable of passing the error correction parity check (ECC parity check) performed by the data processing circuit 1046.

Figure 5:
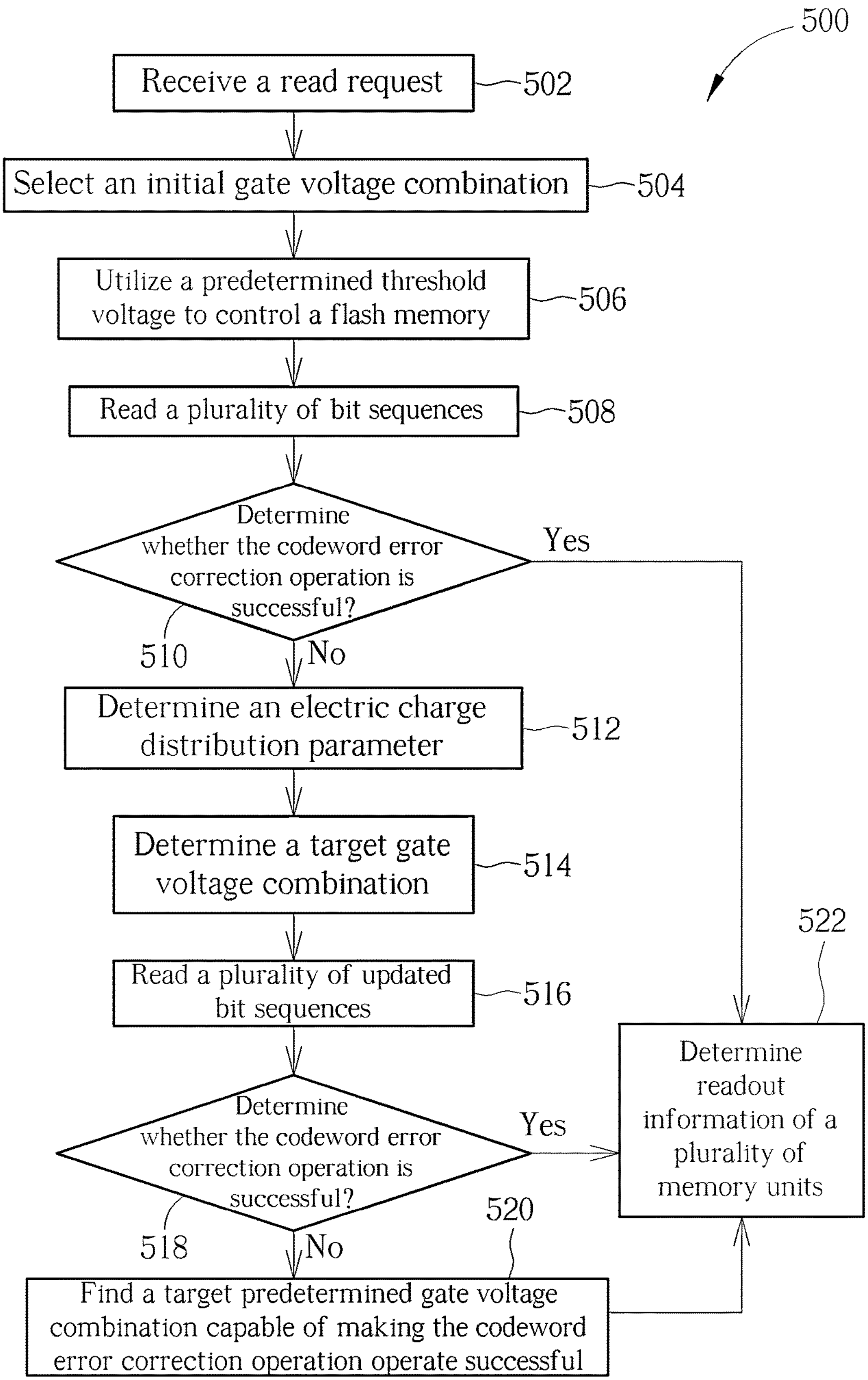
FIG. 5 is a flowchart illustrating a method of using a memory controller to read data stored in a flash memory according to an embodiment of the present invention.

Please refer to FIG. 5, which is a flowchart illustrating a method 500 of using the memory controller 104 to read data stored in the flash memory 102 according to an embodiment of the present invention. If the result is substantially the same, the steps are not required to be continuously executed in the exact order shown in FIG. 5. That is, other steps can be exerted therein. The exemplary method shown in FIG. 5 may be briefly summarized as follows.

Step 502: A memory controller 104 receives a read request.

Step 504: Utilize a control logic circuit 1042 to select an initial gate voltage combination OP_ini from a plurality of predetermined gate voltage combination options OP_1-OP_M.

Step 506: Utilize the control logic circuit 1042 to control a plurality of memory units M_0-M_K of the physical page (e.g. P_0) in a flash memory 102 according to predetermined threshold voltages (e.g., [VT1_1:VT1_7]) corresponding to the initial gate voltage combination OP_ini in the first LUT 1041*a*.

Step 508: Utilize the receiving circuit 1044 to read a plurality of bit sequences BS_0, BS_1, . . . , BS_K.

Step 510: Utilize the data processing circuit 1046 to perform a codeword error correction operation upon the plurality of bit sequences BS_0, BS_1, . . . , BS_K, and determine whether the codeword error correction operation is successful. If yes, go to step 522; otherwise, go to step 512.

Step 512: Utilize the data processing circuit 1046 to determine an electric charge distribution parameter A_1 corresponding to the initial gate voltage combination OP_ini.

Step 514: Utilize the control logic circuit 1042 to determine a target gate voltage combination OP_tar1 (e.g., the target gate voltage combination OP_tar1 may be OP_2) corresponding to the electric charge distribution parameter A_1 according to a second LUT 1041*b*.

Step 516: Utilize the control logic circuit 1042 to control the plurality of memory units M_0-M_K of the target physical page according to the target gate voltage combination OP_tar1, to read a plurality of updated bit sequences BSU_0, BSU_1, . . . , BSU_K.

Step 518: Utilize the data processing circuit 1046 to perform the codeword error correction operation upon the plurality of updated bit sequences BSU_0, BSU_1, . . . , BSU_K, and determine whether the codeword error correction operation is successful. If yes, go to step 522; otherwise, go to step 520.

Step 520: Utilize the control logic circuit 1042 to refer to the first LUT 1041*a* to sequentially utilize other predetermined gate voltage combinations, other than the initial gate voltage combination OP_ini and the target gate voltage combination OP_tar1 in the plurality of predetermined gate voltage combination options OP_1-OP_M, to control the plurality of memory units in the memory units M_0-M_K in the flash memory 102, so as to find a target predetermined gate voltage combination capable of making the codeword error correction operation operate successfully, and update the original target gate voltage combination OP_tar1 in the second LUT 1042*b*. Go to step 522.

Step 522: Utilize the data processing circuit 1046 to determine readout information of a plurality of memory units M_0-M_K of the target physical page.

Please refer to FIG. 4 again. According to an embodiment of the present invention, the first column of the second LUT 1041*b* in the storage unit 1041 is used to store a plurality of electric charge distribution parameter A_1-A_N, and the second column of the second LUT 1041*b* is used to record the corresponding target gate voltage combinations OP_tar1-OP_tarN. Hence, in step 514, if the target gate voltage combination OP_tar1 corresponding to the electric charge distribution parameter A_1 is determined to be the predetermined gate voltage combination option OP_2 according to the second LUT 1041*b*, the control logic circuit 1042 will find the predetermined threshold voltages [VT2_1:VT2_7] corresponding to the predetermined gate voltage combination option OP_2 from the first LUT 1041*a*, and use the predetermined threshold voltages [VT2_1:VT2_7] to control the plurality of memory units M_0-M_K of the target physical page (e.g., P_0) in the flash memory 102. In other words, according to this embodiment, when the initial gate voltage combination OP_ini previously selected by the control logic circuit 1042 makes the number of error bits existing in the readout information exceed an largest number of error bits correctable by the ECC detector 1046, the data processing circuit 1046 will determine/calculate the electric charge distribution parameter A_1 corresponding to the initial gate voltage combination OP_ini. Next, the control logic circuit 1042 utilizes the second LUT 1041*b* to find the target gate voltage combination OP_tar1 corresponding to the electric charge distribution parameter A_1. Since the target gate voltage combination OP_tar1 is selected from one of the predetermined gate voltage combination options OP_1-OP_M (e.g., the predetermined gate voltage combination option OP_2) after the control logic circuit 1042 finds the target gate voltage combination OP_tar1 corresponding to the electric charge distribution parameter A_1, the control logic circuit 1042 will find the predetermined threshold voltages [VT2_1:VT2_7] corresponding to the target gate voltage combination OP_tar1 (e.g., the predetermined gate voltage combination option OP_2) from the first LUT 1041*a*, to control the plurality of memory units M_0-M_K of the target physical page (e.g., P_0) in the flash memory 102.

Similarly, the receiving circuit 1044 reads the plurality of updated bit sequences BSU_0, BSU_1, . . . , BSU_K generated by utilizing the target gate voltage combination OP_tar1. Next, the data processing circuit 1046 performs the codeword error correction operation upon the plurality of updated bit sequences BSU_0, BSU_1, . . . , BSU_K again, and determines whether the codeword error correction operation is successful. If the number of error bits actually existing in the readout information does not exceed the largest number of error bits correctable by the ECC detector 1046, it means that the error correction is capable of completely correcting all errors in the readout codewords. Hence, the data processing circuit 1046 utilizes the plurality of updated bit sequences BSU_0, BSU_1, . . . , BSU_K read by the target gate voltage combination OP_tar1 to determine the readout information of the plurality of memory units M_0-M_K of the target physical page.

Figure 6:
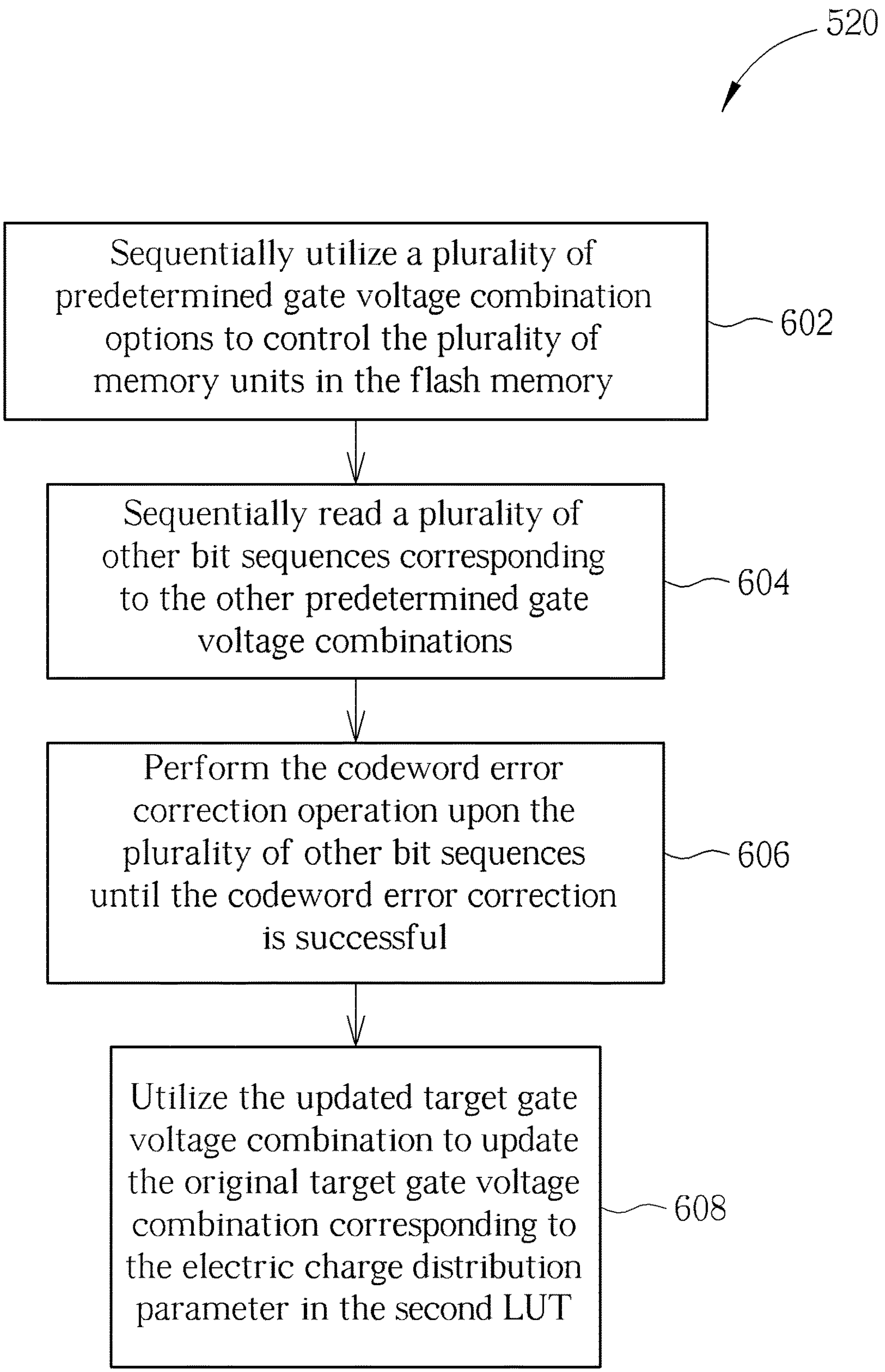
FIG. 6 is a flowchart illustrating a step in FIG. 5 according to an embodiment of the present invention.

On the contrary, if the number of error bits actually existing in the readout information still exceeds the largest number of error bits correctable by the ECC detector 1046, the error correction operation is not capable of completely correcting all errors in the readout codewords. It means that the correspondence between the electric charge distribution parameter A_1 and the target gate voltage combination OP_tar1 is incorrect. Hence, the target gate voltage combination OP_tar1 needs to be updated to another target gate voltage combination, to make the error correction able to completely correct all errors in the readout codewords, as shown in FIG. 6. Please refer to FIG. 6, which is a flowchart illustrating step 520 of the method 500 according to an embodiment of the present invention. If the result is substantially the same, the steps are not required to be continuously executed in the exact order shown in FIG. 6. That is, other steps can be exerted therein. Step 520 includes the following steps:

Step 602: Utilize the election unit 1042*b* of the control logic circuit 1042 to sequentially utilize other predetermined gate voltage combinations, other than the initial gate voltage combination OP_ini and the target gate voltage combination OP_tar1 in the plurality of predetermined gate voltage combination options OP_1-OP_M, to control the plurality of memory units M_0-M_K in the flash memory 102.

Step 604: Utilize the receiving circuit 1044 to sequentially read a plurality of other bit sequences corresponding to the other predetermined gate voltage combination.

Step 606: Utilize the data processing circuit 1046 to sequentially perform the codeword error correction operation upon the plurality of other bit sequences until the codeword error correction is successful.

Step 608: Utilize the setting unit 1046*a* of the data processing circuit 1046 to set the other predetermined gate voltage combination corresponding to the successful codeword error correction operation as the target gate voltage combination OP_tar1 corresponding to the electric charge distribution parameter A_1, and utilize the updated target gate voltage combination OP_tar1 to update the original target gate voltage combination OP_tar1 corresponding to the electric charge distribution parameter A_1 in the second LUT 1041*b*.

For example, if the initial gate voltage combination OP_ini is the predetermined gate voltage combination option OP_1, and the original target gate voltage combination OP_tar1 is the predetermined gate voltage combination option OP_2, the selection unit 1042*b* of the control logic circuit 1042 will sequentially utilize the predetermined gate voltage combination options, starting from the predetermined gate voltage combination option OP_3 in the first LUT 1041*a*, to control the plurality of memory units M_0-M_K in the flash memory 102. Further, the receiving circuit 1044 also reads the plurality of other bit sequences corresponding to the other predetermined gate voltage combination. Meanwhile, the data processing circuit 1046 sequentially performs the codeword error correction operation upon the plurality of other bit sequences. For example, if the plurality of other bit sequences generated when the control logic circuit 1042 utilizes the predetermined gate voltage combination OP_3 to control the plurality of memory units M_0-M_K makes the codeword error correction operation successful, it shows that, in the second LUT 1041*b*, the predetermined gate voltage combination OP_2 previously corresponding to the electric charge distribution parameter A_1 needs to be updated as the predetermined gate voltage combination OP_3. In this way, if the data processing circuit 1046 obtains an electric charge distribution parameter A_1 of another set of a plurality of bit sequences next time, the control logic circuit 1042 will directly utilize the second LUT 1041*b* to find out the target gate voltage combination OP_tar1 corresponding to the electric charge distribution parameter A_1 (i.e., the predetermined gate voltage combination OP_3) to control the corresponding memory units.

Hence, it can be seen from the above operations in FIG. 5 and FIG. 6 that, the correspondence of the second LUT 1041*b* of the storage unit 1041 is not immutable, but is updated with the condition of the electric charge drift in the memory units M_0-M_K. More specifically, with the increase of the program/erase/read count and/or data retention time, drift/shift may occur in the electric charge distribution in the plurality of memory units M_0-M_K again, making the target gate voltage combination OP_tar1 corresponding to the electric charge distribution parameter A_1 in the second LUT 1041*b* no longer the best threshold voltage combination. Hence, the control logic circuit 1042 will anew search a best threshold voltage combination corresponding to the electric charge distribution parameter A_1, i.e. another target gate voltage combination, to update the second LUT 1041*b*. Similarly, the target gate voltage combinations OP_tar1-OP_traN respectively corresponding to the electric charge distribution parameters A_1-A_N in the second LUT 1041*b* may be updated as new target gate voltage combinations. Hence, the correspondence of the second LUT **1041*b* is updated with the increase of the program/erase/read count and/or data retention time of the flash memory 102**.

Further, in the flowchart of FIG. 5, although step 504 of the method 500 first refers to the first LUT **1041*a* to select predetermined threshold voltage corresponding to the initial gate voltage combination OP_ini, to control the plurality of memory units M_0-M_K, the present invention is not limited thereto. The method 500 of the present invention may skip steps 504-510 and directly find the corresponding target gate voltage combination from the second LUT 1041_ according to an electric charge distribution parameter of a plurality of memory units M_0-M_K, to read the information of the plurality of memory units M_0**-M_K.

Moreover, although the storage unit 1041 shown in the embodiment of FIG. 4 stores two LUTs (i.e., the first LUT **1041*a* and the second LUT 1041*b***), the present invention is not limited thereto. The two exemplary LUTs are illustrated to conveniently describe the technical features of the present invention. One skilled in the art should understand that using only a single LUT may achieve the same objective, and the detailed descriptions thereof are omitted here for brevity.

Figure 7:
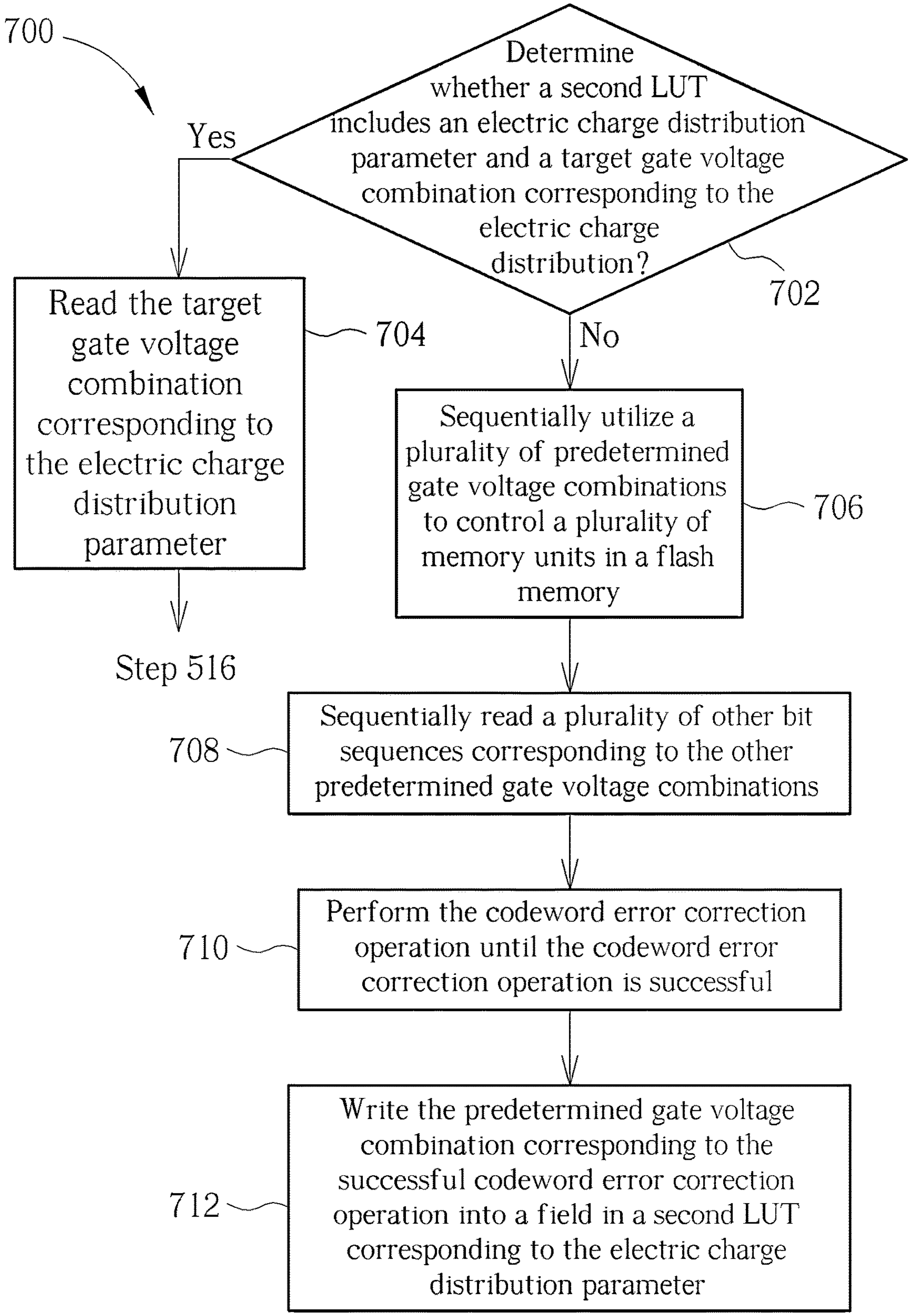
FIG. 7 is a flowchart illustrating a method of creating a second look-up table according to an embodiment of the present invention.

On the other hand, in FIGS. 1 and 4, although the second LUT **1041*b* seems to store the plurality of electric charge distribution parameters A_1-A_N and the corresponding target gate voltage combinations OP_tar1-OP_tarN in advance, it is merely for the convenience of describing the technical features of the present invention, and not meant to be a limitation. Specifically, one skilled in the art should realize that, when the flash memory 102 and the memory controller 104 are just manufactured, the second LUT 1041*b* is actually empty, and only the contents of the first LUT 1041*a* are pre-defined by the manufacturer. However, with the increase of the program/erase/read count and/or data retention time, drift/shift may occur in the electric charge distribution in the plurality of memory units M_0-M_K, resulting in error correction failure of the BS_0, BS_1, . . . , BS_K read by utilizing the initial gate voltage combination OP_ini. At this moment, the data processing circuit 1046 determines the first electric charge distribution parameter A_1 corresponding to the initial gate voltage combination OP_ini according to the plurality of bit sequences BS_0, BS_1, . . . , BS_K. Then, the control logic circuit 1042 refers to the first LUT 1041*a* to sequentially utilize other predetermined gate voltage combinations, other than the initial gate voltage combination OP_ini in the plurality of predetermined gate voltage combination options OP_1-OP_M, to control the plurality of memory units in the memory units M_0-M_K in the flash memory 102, to find a target predetermined gate voltage combination capable of making the codeword error correction operation successful, and write the first electric charge distribution parameter A_1 and the target gate voltage combination OP_tar1 corresponding to the electric charge distribution parameter A_1 into the second LUT 1041*b*, as shown in FIG. 7. FIG. 7 is a flowchart illustrating a method 700 of creating the contents of the second LUT 1041*b* in the method 500 according to an embodiment of the present invention. If the result is substantially the same, the steps are not required to be continuously executed in the exact order shown in FIG. 7. That is, other steps can be exerted therein. The exemplary method shown in FIG. 7** may be briefly summarized as follows.

Step 702: Utilize the determining unit **1042*a* of the control logic circuit 1042 to determine whether the second LUT 1041*b* includes the electric charge distribution parameter A_1 and the target gate voltage combination OP_tar1 corresponding to the target gate voltage combination OP_tar1. If yes, go to step 704; otherwise, go to step 706**.

Step 704: Utilize the control logic circuit 1042 to read the target gate voltage combination OP_tar1 corresponding to the electric charge distribution parameter A_1 from the second LUT **1041*b*. Go to step 516 in FIG. 5**.

Step 706: Utilize the selection unit **1042*b* of the control logic circuit 1042 to sequentially utilize other predetermined gate voltage combinations, other than the initial gate voltage combination OP_ini in the plurality of predetermined gate voltage combination options OP_1-OP_M of the first LUT 1041*a*, to control the plurality of memory units in the memory units M_0-M_K in the flash memory 102**.

Step 708: Utilize the receiving circuit 1044 to sequentially read a plurality of other bit sequences corresponding to the other predetermined gate voltage combination.

Step 710: Utilize the data processing circuit 1046 to sequentially perform the codeword error correction operation upon the plurality of other bit sequences until the codeword error correction operation is successful.

Step 712: Utilize the setting unit **1046*a* of the data processing circuit 1046 to set the other predetermined gate voltage combination corresponding to the successful codeword error correction operation as the target gate voltage combination OP_tar1 corresponding to the electric charge distribution parameter A_1, and write the electric charge distribution parameter A_1 into a field in the second LUT 1041*b* corresponding to the electric charge distribution parameter A_1**.

Similarly, if the data processing circuit 1046 determines that the electric charge distribution parameter corresponding to the initial gate voltage combination OP_ini is another electric charge distribution parameter (e.g., A_2) according to the plurality of bit sequences BS_0, BS_1, . . . , BS_K, then the control logic circuit 1042 also performs the aforementioned steps 704-712 to find the second target gate voltage combination OP_tar2, and writes the second target gate voltage combination OP_tar2 into the field of the second LUT **1041*b* corresponding to the second electric charge distribution parameter A_2. In this way, with the increase of the program/erase/read count and/or retention data time, the correspondence between the plurality of different electric charge distribution parameters A_1-A_N of the second LUT 1041*b* and the target gate voltage combinations OP_tar1-OP_tarN may be automatically created. After that, when the codeword error correction operation performed upon the plurality of bit sequences BS_0, BS_1, . . . , BS_K by the data processing circuit 1046 is not successful, the data processing circuit 1046 will determine an electric charge distribution parameter corresponding to the plurality of bit sequences BS_0, BS_1, . . . , BS_K, and then directly find a target gate voltage combination from the second LUT 1041*b* according to the electric charge distribution parameter, without the need of individually testing predetermined voltage combination options OP_1-OP_M again. Hence, the memory controller 104 of the present invention may read the information stored in the memory units M_0-M_K of the flash memory 102 more quickly, and decrease or eliminate uncorrectable error(s) existing in the codewords read from the memory units M_0**-M_K.

It can be seen from the above operations of the memory system 100 that, the present invention does not limit the parameter types of the electric charge distribution parameters stored in the memory units M_0-M_K. That is, any parameters representing/indicating the drift/shift/distribution conditions of the electric charges stored in the memory units M_0-M_K fall within the scope of the present invention. For example, in one of the embodiments of the present invention (e.g., an embodiment suitable for the memory system 100 shown in FIG. 1), the electric charge distribution parameter is a syndrome-weight generated after the codeword error correction operation is performed. That is, the first column of the aforementioned second LUT 1041*b* is used to store different syndrome-weights A_1-A_N, and the second column of the second LUT 1041*b* is used to record the corresponding different target gate voltage combinations OP_tar1-OP_tarN. Please note that, in this embodiment, the codeword error correction operation performed upon the plurality of bit sequences BS_0, BS_1, . . . , BS_K by the data processing circuit 1046 is, for example, a low density parity-check (LDPC) operation. When the number of bit values each equal to 1 in a syndrome-weight generated by the LDPC operation is larger, it means that the number of error bits actually existing in the readout information becomes larger. Hence, a syndrome-weight may be used to represent/indicate the drift/shift/distribution conditions of the electric charges stored in the memory units M_0-M_K. Please note that, the electric charge distribution parameters (i.e., the syndrome-weights) adopted by the present invention are extracted from the data generated by performing the codeword error correction upon the plurality of bit sequences BS_0, BS_1, . . . , BS_K. However, this is not a limitation to the present invention. In other words, the electric charge distribution parameters of the present invention may be extracted/analyzed from the plurality of bit sequences BS_0, BS_1, . . . , BS_K received by the receiving circuit 1044, without the need of utilizing the data generated by the codeword error correction operation.

Figure 8:
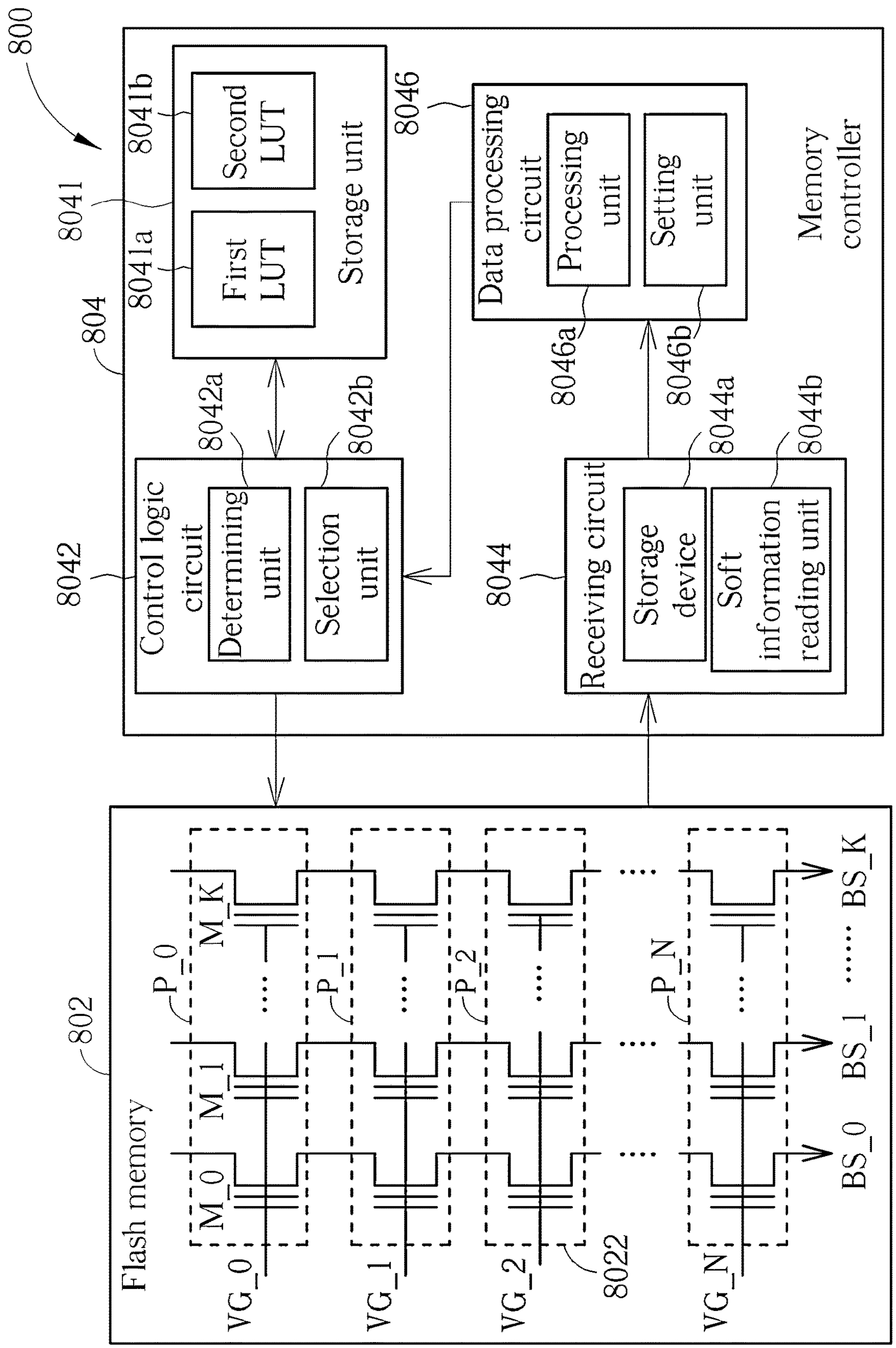
FIG. 8 is a diagram illustrating a memory system according to a second embodiment of the present invention.

In another embodiment of the present invention, the electric charge distribution parameter is derived from soft information of a flash memory. Please refer to FIG. 8, which is a diagram illustrating a memory system 800 according to a second embodiment of the present invention. The memory system 800 includes a flash memory 802 and a memory controller 804. In this embodiment, the flash memory 802 may be a NAND flash memory which includes the plurality of physical page P_0, P_1, P_2, . . . , P_N, wherein each physical page of the physical pages P_0-P_N includes a plurality of memory units (e.g., floating gate transistors) 8022 controlled by the control gate voltages VG_0-VG_N, respectively. The memory controller 804 is used to control the access (read/write) of the flash memory 802, and includes (but not limited to) a storage unit 8041, a control logic circuit 8042, a receiving circuit 8044 and a data processing circuit 8046. The storage unit 8041 stores a first LUT 8041*a* and a second LUT 8041*b*. The control logic circuit 8042 includes a determining unit 8042*a* and a selection unit 8042*b*. The receiving circuit 8044 includes a storage device (e.g., a memory device) 8044*a* and a soft information reading unit 8044*b*. The data processing circuit 8046 includes a processing unit 8046*a* and a setting unit 8046*b*. Please note that, compared with the embodiment shown in FIG. 1, when the memory controller 804 of the present invention utilizes a predetermined voltage combination option (e.g., OP_1) in the first LUT 8041*a* to read the information of the plurality of memory units M_0-M_K in the flash memory 802, the receiving circuit 8044 in this embodiment not only reads the plurality of bit sequences BS_0, BS_1, . . . , BS_K, but also reads the soft information corresponding to the predetermined voltage combination option (e.g., OP_1).

In general, if the bit value stored in a memory unit is either 0 or 1, this memory unit is a single level cell (SLC) storage unit. The so-called soft information may be additional bit(s) received from reading the memory unit. When the memory controller 804 utilizes a threshold voltage to read the memory unit, the receiving circuit 4044 not only receives the bit value, but also receives two bits (or one bit), wherein values represented by the two bits (or one bit) is used to indicate the strength of the bit value stored in the memory unit. For example, if the bit value received by the receiving circuit 4044 is 0, and the values of the two bits are 11, it shows that the bit value is a very strong (i.e., high reliability) "0" value; if the values of the two bit are 00, it shows that the bit value is a very weak (i.e., low reliability) "0" value. According to the above concept, the strength of the bit values stored in the memory unit may be divided into four rankings, such as the strongest to the weakest rankings are 11, 10, 01 and 00, respectively. If the values of the two bits are 11, it means that the threshold voltage set by the memory controller 804 is the best; if the values of the two bits are 10, it means that the threshold voltage set by the memory controller 804 is the second best, and so on. Hence, when the values of the two bits are 00, it means that the threshold voltage set by the memory controller 804 is the worst. That is, when the values of the two bits are 00, the shift/drift of the electric charges in the memory unit is largest. Please note that this paragraph describes the reading condition of the soft information when the memory unit is an SLC storage unit, and the following paragraphs and figures describe the reading condition of the soft information when the memory unit is a multi-level cell (MLC) storage unit.

Figure 9:
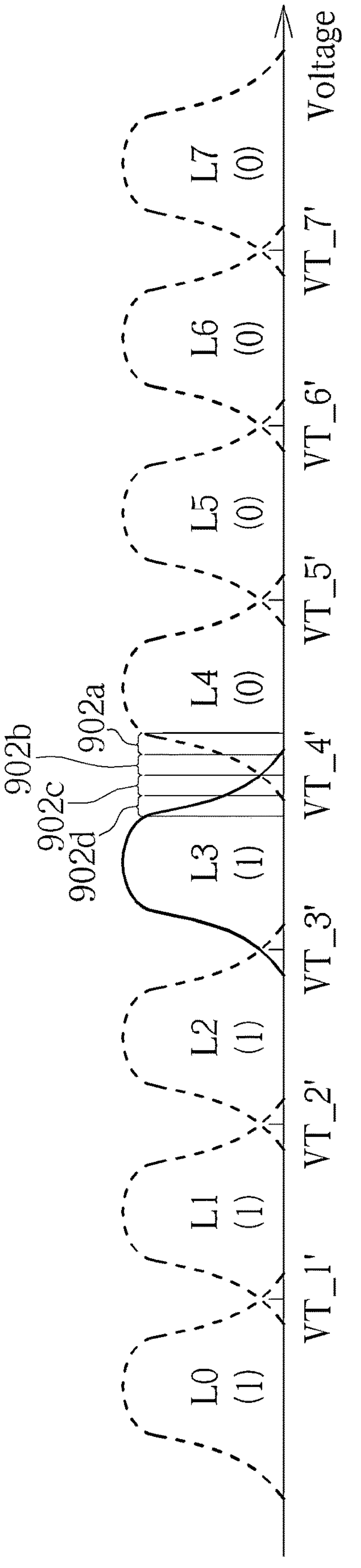
FIG. 9 is a diagram illustrating an operation of reading a soft bit of a least significant bit from a memory unit of a flash memory.

Please refer to FIG. 9, which is a diagram illustrating the operation of reading a soft bit (i.e., the soft information value) of an LSB from a memory unit of the flash memory 802. According to the examples of the threshold voltage distributions shown in FIGS. 2 and 3, any memory unit having one of the electric charge levels L0-L3 will store an LSB=1, and any memory unit having one of the electric charge levels L4-L7 will store an LSB=0. Take the memory unit M_0 shown in FIG. 8 as an example. Assuming that the bits stored in the memory unit M_0 is (1, 0, 1), i.e. (MSB, CSB, LSB)=(1, 0, 1), when the memory controller 804 reads the LSB of the memory unit M_0, the value read by the receiving circuit 8044 will be bit "1". In other words, the electric charge distribution stored in the memory unit M_0 is L3 as shown in FIG. 9. Please note that in FIG. 9, the solid-line curve represents the electric charge distribution of the electric charge level L3 in the memory unit M_0, and the dotted-line curves are used to show reference locations of the electric charge distributions of electric charge levels L0-L2 and L4-L7, which are not the actual electric charge distributions of the memory unit M_0. Hence, the threshold voltage VT_4' used by the memory controller 804 to read the LSB bit value of the memory unit M_0 may fall within one of four possible voltage ranges 902*a*-902*d*. If the threshold voltage VT_4' falls within the voltage range 902*a*, it means that all of the electric charges stored in the memory unit M_0 will be read. In other words, if the threshold voltage VT_4' falls within the voltage range 902*a*, it means that the bit value read from the memory unit M_0 has the highest reliability, and thus the values of the two bits of the soft information corresponding to the LSB of the memory unit M_0 are 11. Similarly, if the threshold voltage VT_4' falls within the voltage range 902*b*, it means that the bit value read from the memory unit M_0 has the second highest reliability, and thus the values of the two bits of the soft information corresponding to the LSB of the memory unit M_0 are 10. If the threshold voltage VT_4' falls within the voltage range 902*c*, it means that the bit value read from the memory unit M_0 has the second lowest reliability, and thus the values of the two bits of the soft information corresponding to the LSB of the memory unit M_0 are 01. If the threshold voltage VT_4' falls within the voltage range 902*d*, it means that the bit value read from the memory unit M_0 has the lowest reliability, and thus the values of the two bits of the soft information corresponding to the LSB of the memory unit M_0 are 00. Hence, when the memory controller 804 utilizes a threshold voltage to read a bit from a memory unit, besides the bit value stored in the memory unit, the memory controller 804 further obtains the soft information corresponding to the bit value for determining the reliability of the bit value. Please note that, in this embodiment, the memory controller 804 utilizes two bits (e.g., the aforementioned four possible voltage ranges 902*a*-902*d*) to indicate the strength of the bit value of the LSB value, but it is not meant to be a limitation to the present invention. In other embodiments, using one bit or three bits to indicate the strength of the bit value of the LSB is feasible.

Further, as shown in FIG. 9, the electric charge distribution stored in the memory unit M_0 is the electric charge level L3. However, if the electric charge distribution stored in the memory unit M_0 is the electric charge level L4 (i.e. (MSB, CSB, LSB)=(1, 0, 0)) instead of L3, it means that when the threshold voltage VT_4' falls within the voltage range 902*d*, the reliability of the bit value (i.e., LSB=0) read from the memory unit M_0 is highest, and thus the values of the two bits of the soft information corresponding to the LSB of the memory unit M_0 are 11. Similarly, if the threshold voltage VT_4' falls within the voltage range 902*c*, it means that the reliability of the bit value read from the memory unit M_0 is the second highest, and thus the values of the two bits of the soft information corresponding to the LSB of the memory unit M_0 are 10. If the threshold voltage VT_4' falls within the voltage range 902*b*, it means that the reliability of the bit value read from the memory unit M_0 is the second lowest, and thus the values of the two bits of the soft information corresponding to the LSB of the memory unit M_0 are 01. If the threshold voltage VT_4' falls within the voltage range 902*a*, it means that the reliability of the bit value read from the memory unit M_0 is the lowest, and thus the values of the two bits of the soft information corresponding to the LSB of the memory unit M_0 are 00.

Please note that, when the memory controller 804 reads the LSB of the memory unit M_0, the electric charge distributions stored in the memory unit M_0 may be one of the electric charge levels L0-L2 and L5-L7. Hence, no matter which one of the voltage range 902*a*-902*d* into which the threshold voltage VT_4' falls, the bit value of the LSB in the electric charge levels L0-L2, L5-L7 may be successfully read, as shown in FIG. 9. As one skilled in the art should realize the detailed operation principles thereof, further descriptions are omitted here for brevity.

Figure 10:
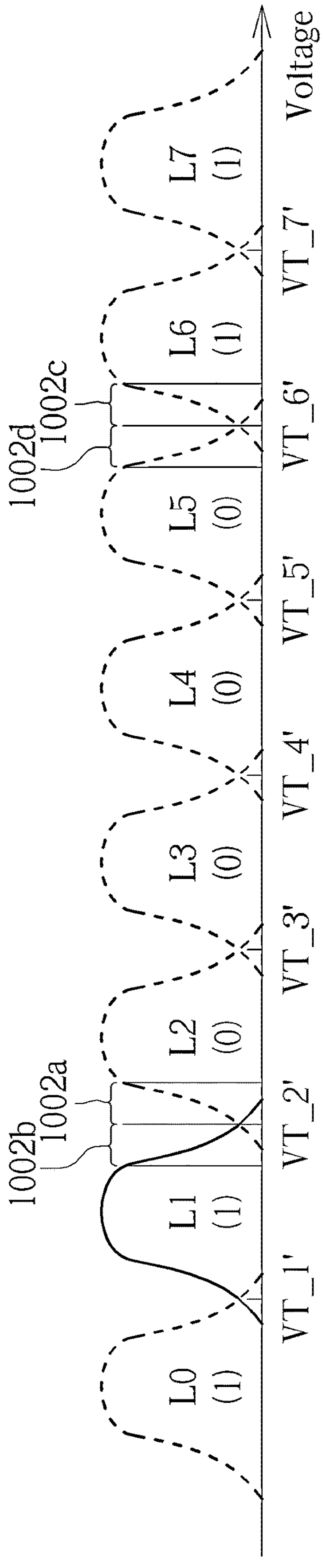
FIG. 10 a diagram illustrating an operation of reading a soft bit of a central significant bit from a memory unit of a flash memory.

Please refer to FIG. 10, which a diagram illustrating the operation of reading a soft bit (i.e., the soft information value) of a central significant bit (CSB) from a memory unit of the flash memory 802. According to the examples of the threshold voltages shown in FIGS. 2 and 3, the memory unit having any one of the electric charge levels L0, L1, L6, L7 will store CSB=1, and the memory unit having any one of the electric charge levels L2-L5 will store CSB=0. Take the memory unit M_0 shown in FIG. 9 as an example. Assuming that the bit stored by the memory unit M_0 is (0, 1, 1), i.e. (MSB, CSB, LSB)=(0, 1, 1), when the memory controller 804 reads the CSB of the memory unit M_0, the bit read by the receiving circuit 8044 will be bit "1". That is, the electric charge distributions stored in the memory unit M_0 is the electric charge level L1 as shown in FIG. 10. Please note that in FIG. 10, the solid-line curve represents the electric charge distribution of the electric charge level L1 in the memory unit M_0, and the dotted-line curves represent reference locations of the electric charge distributions of electric charge levels L0 and L2-L7, which are not the actual electric charge distributions of the memory unit M_0. Hence, the threshold voltage VT_2' used by the memory controller 804 to read the CSB bit values in the memory unit M_0 may fall within one of two possible voltage ranges 1002*a*-1002*b*. If the threshold voltage VT_2' falls within the voltage range 1002*a*, it means that all of the electric charges stored in the memory unit M_0 will be read. In other words, if the threshold voltage VT_2' falls within the voltage range 1002*a*, it means that the reliability of the bit values read from the memory unit M_0 is the highest, and thus the value of the single bit corresponding to the soft information of the CSB of the memory unit M_0 is 1. Similarly, if the threshold voltage VT_2' falls within the voltage range 1002*b*, it means that the reliability of the bit values read from the memory unit M_0 is the lowest, and thus the value of the single bit corresponding to the soft information of the CSB of the memory unit M_0 is 0. Hence, when the memory controller 804 utilizes a threshold voltage to read a bit of a memory unit, besides the bit values stored in the memory unit, the memory controller 804 further obtains the soft information corresponding to the bit value for determining the reliability of the bit value. Please note that in this embodiment, the memory controller 804 utilizes one bit (i.e., the aforementioned possible voltage ranges 1002*a*-1002*b*) to indicate the strength of the read CSB value, but it is not meant to be a limitation to the present invention. In other embodiments, using two or three bits to indicate the strength of the CSB bit value is feasible.

Further, in the above embodiment of FIG. 10, the electric charge distributions stored in the memory unit M_0 is the electric charge level L1. However, if the electric charge distribution stored in the memory unit M_0 is the electric charge level L2 (i.e. MSB, CSB, LSB)=(0, 0, 1)), when the threshold voltage VT_2' falls within the voltage range 1002*b*, it means that the reliability of the bit value (i.e., CSB=0) read from the memory unit M_0 is the highest. Hence, the value of the single bit corresponding to the soft information of the CSB of the memory unit M_0 is 1. Similarly, if the threshold voltage VT_2' falls within the voltage range 1002*a*, it means that the reliability of the bit value read from the memory unit M_0 is the lowest, and thus the value of the single bit corresponding to the soft information of the CSB of the memory unit M_0 is 0.

Moreover, if the electric charge distribution stored in the memory unit M_0 is the electric charge level L5 (i.e. (MSB, CSB, LSB)=(0, 0, 0)), when the threshold voltage VT_6' falls within the voltage range 1002*c*, it means that the reliability of the bit value (i.e., CSB=0) read from the memory unit M_0 is the highest, and thus the value of the single bit corresponding to the soft information of the CSB of the memory unit M_0 is 1. Similarly, if the threshold voltage VT_6' falls within the voltage range 1002*d*, it means that the reliability of the bit value read from the memory unit M_0 is the lowest, and thus the value of the single bit corresponding to the soft information of the CSB of the memory unit M_0 is 0.

Furthermore, if the electric charge distribution stored in the memory unit M_0 is the electric charge level L6 (i.e. (MSB, CSB, LSB)=(0, 1, 0)), when the threshold voltage VT_6' falls within the voltage range 1002*d*, it means that the reliability of the bit value (i.e., CSB=1) read from the memory unit M_0 is the highest, and thus the value of the single bit corresponding to the soft information of the CSB of the memory unit M_0 is 1. Similarly, if the threshold voltage VT_6' falls within the voltage range 1002*c*, it means that the reliability of the bit value read from the memory unit M_0 is the lowest, and thus the value of the single bit corresponding to the soft information of the CSB of the memory unit M_0 is 0.

Please note that, when the memory controller 804 reads the CSB of the memory unit M_0, the electric charge distribution stored in the memory unit M_0 may be one of the electric charge levels L1, L3-L4, and L7. Hence, no matter which one of the voltage range 1002*a*-1002*b* into which the threshold voltage VT_2' falls and no matter which one of the voltage range 1002*c*-1002*d* into which the threshold voltage VT_6' falls, the memory controller 804 may successfully read the CSB bit value from the electric charge levels L1, L3-L4, L7 as shown in FIG. 10. As one skilled in the art should realize the detailed operation theories thereof, descriptions are omitted here for brevity.

Figure 11:
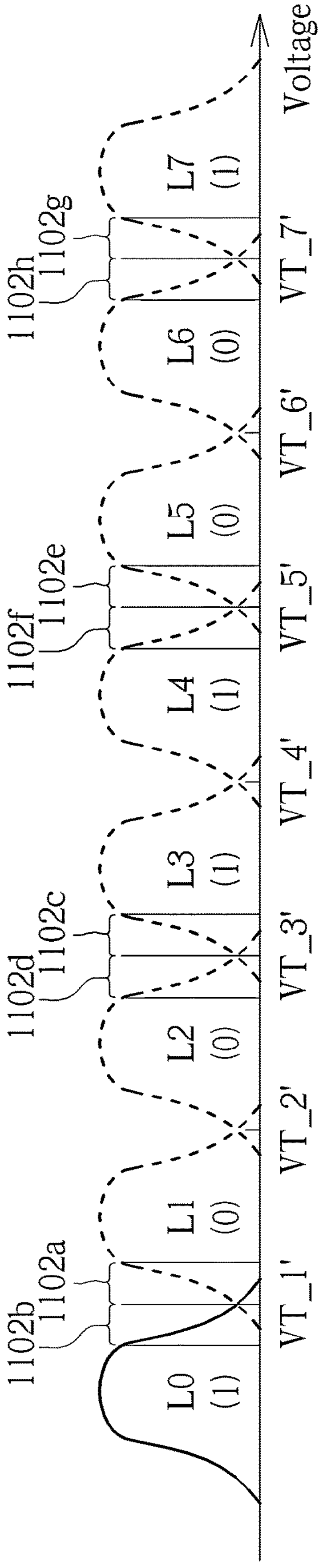
FIG. 11 a diagram illustrating an operation of reading a soft bit of a most significant bit from a memory unit of a flash memory.

Please refer to FIG. 11, which is a diagram illustrating the operation of reading a soft bit (i.e. the soft information value) of a most significant bit (MSB) from a memory unit of a flash memory 802. According to the examples of the threshold voltage distributions shown in FIGS. 2 and 3, the memory unit of any one of the electric charge levels L0, L3, L4 and L7 will store MSB=1, and the memory unit of any one of the electric charge levels L1, L2, L5 and L6 will store MSB=0. Take the memory unit M_0 shown in FIG. 11 as an example. Assuming that the bit stored in the memory unit M_0 is (1, 1, 1), i.e. (MSB, CSB, LSB)=(1, 1, 1), when the memory controller 804 reads the MSB of the memory unit M_0, the value read by the receiving circuit 8044 will be bit "1". In other words, the electric charge distribution stored in the memory unit M_0 is the electric charge level L0 as shown in FIG. 11. Please note that in FIG. 11, the solid-line curve represents the electric charge distribution of the electric charge level L0 in the memory unit M_0, and the dotted-line curves represent the reference locations of the electric charge distributions of the electric charge distributions, which are not the actual electric charge distributions in the memory unit M_0. Hence, the threshold voltage VT_1' used by the memory controller 804 to read the bit value of the MSB of the memory unit M_0 may fall within one of the possible voltage ranges 1102*a* and 1102*b*. If the threshold voltage VT_1' falls within the voltage range 1102*a*, it means that all of the electric charge stored in the memory unit M_0 will be read. In other words, if the threshold voltage VT_1' falls within the voltage range 1102*a*, it means that the reliability of the bit value read from the memory unit M_0 is the highest, and thus the value of the single bit corresponding to the soft information of the MSB of the memory unit M_0 is 1. Similarly, if the threshold voltage VT_1' falls within the voltage range 1102*b*, it means that the reliability of the bit value read from the memory unit M_0 is the lowest, and thus the value of the single bit corresponding to the soft information of the MSB of the memory unit M_0 is 0. Hence, when the memory controller 804 utilizes a threshold voltage to read a bit from a memory unit, besides the bit value stored in the memory unit, the memory controller 804 further obtains the bit value corresponding to the soft information for determining the reliability of the bit value. Please note that in this embodiment, the memory controller 804 utilizes one bit (i.e., the aforementioned two possible voltage ranges 1102*a*-1102*b*) to indicate the strength of the readout MSB bit value, but it is not meant to be a limitation to the present invention. In other embodiments, using two or three bits to indicate the strength of the MSB bit value is feasible.

Further, in the above embodiment shown in FIG. 11, the electric charge distribution stored in the memory unit M_0 is the electric charge level L0. However, if the electric charge distribution stored in the memory unit M_0 is the electric charge level L1 (i.e. (MSB, CSB, LSB)=(0, 1, 1)), it means that when the threshold voltage VT_1' falls within the voltage range 1102*b*, the reliability of the bit value (i.e., MSB=0) read from the memory unit M_0 is the highest, and thus the value of the single bit of the soft information of the MSB of the memory unit M_0 is 1. Similarly, if the threshold voltage VT_1' falls within the voltage range 1102*a*, it means that the reliability of the bit value read from the memory unit M_0 is the lowest, and thus the value of the single bit of the soft information of the MSB of the memory unit M_0 is 0.

Moreover, when the electric charge distribution stored in the memory unit M_0 is the electric charge level L2 (i.e., (MSB, CSB, LSB)=(0, 0, 1)), if the threshold voltage VT_3' falls within the voltage range 1102*c*, it means that the reliability of the bit value (i.e., MSB=0) read from the memory unit M_0 is the highest, and thus the value of the single bit of the soft information of the MSB of the memory unit M_0 is 1. Similarly, if the threshold voltage VT_3' falls within the voltage range 1102*d*, it means that the reliability of the bit value read from the memory unit M_0 is the lowest, and thus the value of the single bit of the soft information of the MSB of the memory unit M_0 is 0.

When the electric charge distribution stored in the memory unit M_0 is the electric charge level L3 (i.e., (MSB, CSB, LSB)=(1, 0, 1)), if the threshold voltage VT_3' falls within the voltage range 1102*d*, it means that the reliability of the bit value (i.e., MSB=1) read from the memory unit M_0 is the highest, and thus the value of the single bit of the soft information of the MSB of the memory unit M_0 is 1. Similarly, if the threshold voltage VT_3' falls within the voltage range 1102*c*, it means that the reliability of the bit value read from the memory unit M_0 is the lowest, and thus the value of the single bit of the soft information of the MSB of the memory unit M_0 is 0.

When the electric charge distribution stored in the memory unit M_0 is the electric charge level L4 (i.e., (MSB, CSB, LSB)=(1, 0, 0)), if the threshold voltage VT_5' falls within the voltage range 1102*e*, it means that the reliability of the bit value (i.e., MSB=1) read from the memory unit M_0 is the highest, and thus the value of the single bit of the soft information of the MSB of the memory unit M_0 is 1. Similarly, if the threshold voltage VT_5' falls within the voltage range 1102*f*, it means that the reliability of the bit value read from the memory unit M_0 is the lowest, and thus the value of the single bit of the soft information of the MSB of the memory unit M_0 is 0.

When the electric charge distribution stored in the memory unit M_0 is the electric charge level L5 (i.e., (MSB, CSB, LSB)=(0, 0, 0)), if the threshold voltage VT_5' falls within the voltage range 1102*f*, it means that the reliability of the bit value (i.e., MSB=0) read from the memory unit M_0 is the highest, and thus the value of the single bit of the soft information of the MSB of the memory unit M_0 is 1. Similarly, if the threshold voltage VT_5' falls within the voltage range 1102*e*, it means that the reliability of the bit value read from the memory unit M_0 is the lowest, and thus the value of the single bit of the soft information of the MSB of the memory unit M_0 is 0.

When the electric charge distribution stored in the memory unit M_0 is the electric charge level L6 (i.e., (MSB, CSB, LSB)=(0, 1, 0)), if the threshold voltage VT_7' falls within the voltage range 1102*g*, it means that the reliability of the bit value (i.e., MSB=0) read from the memory unit M_0 is the highest, and thus the value of the single bit of the soft information of the MSB of the memory unit M_0 is 1. Similarly, if the threshold voltage VT_7' falls within the voltage range 1102*h*, it means that the reliability of the bit value read from the memory unit M_0 is the lowest, and thus the value of the single bit of the soft information of the MSB of the memory unit M_0 is 0.

When the electric charge distribution stored in the memory unit M_0 is the electric charge level L7 (i.e., (MSB, CSB, LSB)=(1, 1, 0)), if the threshold voltage VT_7' falls within the voltage range 1102*h*, it means that the reliability of the bit value (i.e., MSB=1) read from the memory unit M_0 is the highest, and thus the value of the single bit of the soft information of the MSB of the memory unit M_0 is 1. Similarly, if the threshold voltage VT_7' falls within the voltage range 1102*g*, it means that the reliability of the bit value read from the memory unit M_0 is the lowest, and thus the value of the single bit of the soft information of the MSB of the memory unit M_0 is 0.

Figure 12:
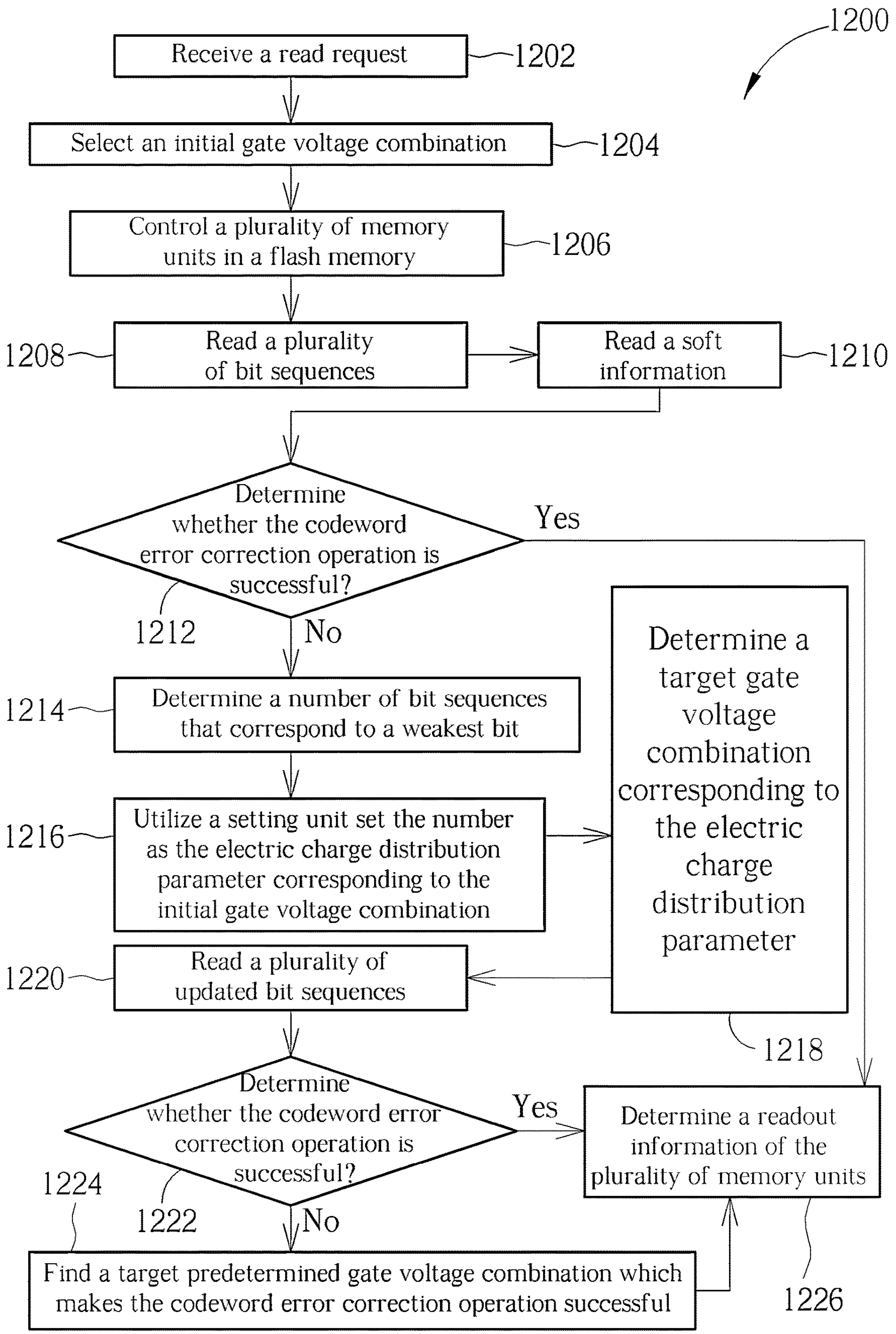
FIG. 12 is a flowchart illustrating another method of using a memory controller to read data stored in a flash memory according to an embodiment of the present invention.

Please refer to FIG. 12, which is a flowchart illustrating a method 1200 of using the memory controller 804 to read data stored in a flash memory 802 according to an embodiment of the present invention. If the result is substantially the same, the steps are not required to be continuously executed in the exact order shown in FIG. 12. That is, other steps can be exerted therein. The exemplary method 1200 shown in FIG. 12 may be briefly summarized as follows.

Step 1202: The memory controller 804 receives a read request.

Step 1204: Utilize the control logic circuit 8042 to select an initial gate voltage combination OP_ini from the plurality of predetermined voltage combination options OP_1-OP_M.

Step 1206: Utilize the control logic circuit 8042 to control the plurality of memory units M_0-M_K of the target physical page (i.e., P_0) according to predetermined threshold voltages (i.e., [VT1_1:VT1_7]) corresponding to the initial gate voltage combination OP_ini in the first LUT 8041*a*.

Step 1208: Utilize the receiving circuit 8044 to read the plurality of bit sequences BS_0, BS_1, . . . , BS_K.

Step 1210: Utilize the soft information reading unit 8044*b* to read the soft information corresponding to the initial gate voltage combination OP_ini.

Step 1212: Utilize the data processing circuit 8046 to perform a codeword error correction operation upon the plurality of bit sequences BS_0, BS_1, . . . , BS_K, and determine whether the codeword error correction operation is successful. If yes, go to step 1226; otherwise, go to step 1214.

Step 1214: Utilize the processing unit 8046*a* of the data processing circuit 8046 to determine the number of bit sequences among the plurality of bit sequences BS_0, BS_1, . . . , BS_K that correspond to a weakest bit (i.e., the number of bit sequences with the lowest reliability) according to the soft information.

Step 1216: Utilize the setting unit 8046*b* to set the number as the electric charge distribution parameter A_1 corresponding to the initial gate voltage combination OP_ini.

Step 1218: Utilize the control logic circuit 8042 to determine a target gate voltage combination OP_tar1 (e.g., the target gate voltage combination OP_tar1 may be OP_2) corresponding to the electric charge distribution parameter A_1 according to the second LUT 8041*b*.

Step 1220: Utilize the control logic circuit 8042 to control the plurality of memory units M_0-M_K of the physical page according to the target gate voltage combination OP_tar1, to read the plurality of updated bit sequences BSU_0, BSU_1, . . . , BSU_K.

Step 1222: Utilize the data processing circuit 8046 to perform the codeword error correction operation upon the plurality of updated bit sequences BSU_0, BSU_1, . . . , BSU_K, and determine whether the codeword error correction operation is successful. If yes, go to step 1226; otherwise, go to step 1224.

Step 1224: Utilize the control logic circuit 8042 to sequentially utilize other predetermine gate voltage combinations, other than the initial gate voltage combination OP_ini of the plurality of predetermined voltage combination options OP_1-OP_M in the first LUT 8041*a*, to control the plurality of memory units M_0-M_K in the flash memory 802, so as to find a target predetermined gate voltage combination which makes the codeword error correction operation successful, and update the original target gate voltage combination OP_tar1 in the second LUT 8041*b*. Go to step 1226.

Step 1226: Utilize the data processing circuit 8046 to determine the readout information of the plurality of memory units of the target physical page.

Please note that, for brevity, the memory system 800 in this embodiment does not depict the internal structure of the storage unit 8041. Since the first LUT 8041*a* and the second LUT 8041*b* in the storage unit 8041 of the memory system 800 are similar to the first LUT 1041*a* and the second LUT 1041*b* of the storage unit 1041 shown in FIG. 4, respectively, the storage unit 1041 shown in FIG. 4 may also be used to realize the storage unit 8041 of the memory system 800. Regarding the technical features related to the memory system 800, the first LUT 8041*a* and the second LUT 8041*b* of the storage unit 8041 may be easily known by referring to above paragraphs directed to the first LUT 1041*a* and the second LUT 1041*b* of the storage unit 1041.

Further, the difference between the memory system 800 in this embodiment and the memory system 100 in the first embodiment is that, the plurality of electric charge distribution parameters A_1-A_N stored in the first column of the second LUT 8041*b* of the memory system 800 indicate the numbers of weakest bits, rather than a plurality of syndrome-weights. The operation procedures of the memory systems 800 and 100 are basically the same except the technical features for determining the plurality of electric charge distribution parameters A_1-A_N. Hence, the method for automatically updating an original target gate voltage combination corresponding to an electric charge distribution parameter in the second LUT 1041*b* as taught in FIG. 6 may also be applied to the memory system 800. Since one skilled should realize the corresponding operation procedure, further descriptions are omitted here for brevity.

Similarly, when the flash memory 802 and the memory controller 804 are just manufactured, the content of the second LUT 8041*b* is empty. Hence, the method for establishing a target gate voltage combination corresponding to an electric charge distribution parameter in the second LUT 1041*b* as taught in FIG. 7 may also be applied to the memory system 800. Since one skilled should realize the corresponding operation procedure, further descriptions are omitted here for brevity.

Hence, according to the memory system 800 of this embodiment, when the codeword error correction operation is not successful, the memory controller 804 will determine the number of weakest bits in the soft information of the plurality of memory units M_0-M_K, and then directly find the target gate voltage combination OP_tar1 corresponding to the number from the second LUT 8041*b*, to control the plurality of memory units M_0-M_K.

Figure 13:
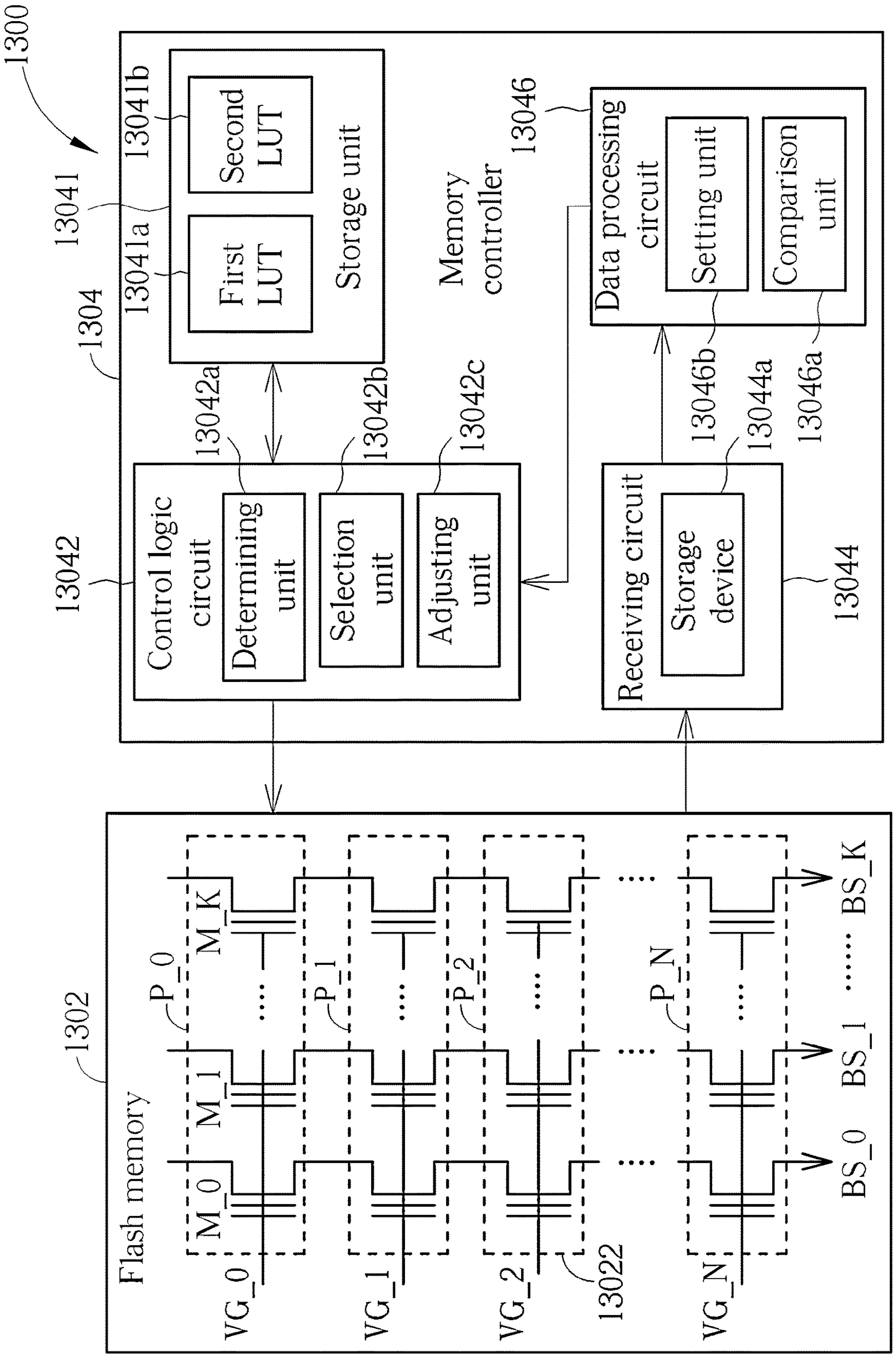
FIG. 13 is a diagram illustrating a memory system according to a third embodiment of the present invention.

In another embodiment of the present invention, the electric charge distribution parameter may be derived from a bit value variation amount between the plurality of bit sequences BS_0, BS_1, . . . , BS_K and the plurality of updated bit sequences BSA_0, BSA_1, . . . , BSA_K. Please refer to FIG. 13, which is a diagram illustrating a memory system 1300 according to a third embodiment of the present invention. The memory system 1300 includes a flash memory 1302 and a memory controller 1304. In this embodiment, the flash memory 1302 may be a NAND flash memory including the plurality of physical page P_0, P_1, P_2, . . . , P_N, wherein each of the physical pages P_0-P_N includes a plurality of memory units (i.e., floating gate transistors) 13022, which are controlled by the control gate voltages VG_0-VG_N, respectively. The memory controller 1304 is used to control the access (read/write) of the flash memory 1302, and includes (but is not limited to) a storage unit 13041, a control logic circuit 13042, a receiving circuit 13044 and a data processing circuit 13046. The storage unit 13041 stores a first LUT 13041*a* and a second LUT 13041*b*. The control logic circuit 13042 includes a determining unit 13042*a*, a selection unit 13042*b* and an adjusting unit 13042*c*. The receiving circuit 13044 includes a storage device (e.g., a memory device) 13044*a*. The data processing circuit 13046 includes a comparison unit 13046*a* and a setting unit 13046*b*. Please note that, compared with the embodiment shown in FIG. 1, when reading the information of the plurality of memory units M_0-M_K in the flash memory 1302, the memory controller 1304 in this embodiment not only utilizes a predetermined voltage combination option (e.g., OP_1) in the first LUT 13041*a* to control the plurality of memory units M_0-M_K in the flash memory 1302, but also adjusts the predetermined voltage combination option to generate an adjusted gate voltage combination, and then utilizes the adjusted gate voltage combination to control the plurality of memory units M_0-M_K in the flash memory 1302. Hence, the receiving circuit 13044 not only reads the plurality of bit sequences BS_0, BS_1, . . . , BS_K, but also reads the plurality of adjusted bit sequences BSA 0, BSA 1, . . . , BSA K. Next, the data processing circuit 13046 determines an electric charge distribution parameter according to the plurality of bit sequences BS_0, BS_1, . . . , BS_K and the plurality of adjusted bit sequences BSA_0, BSA_1, . . . , BSA_K.

Figure 14:
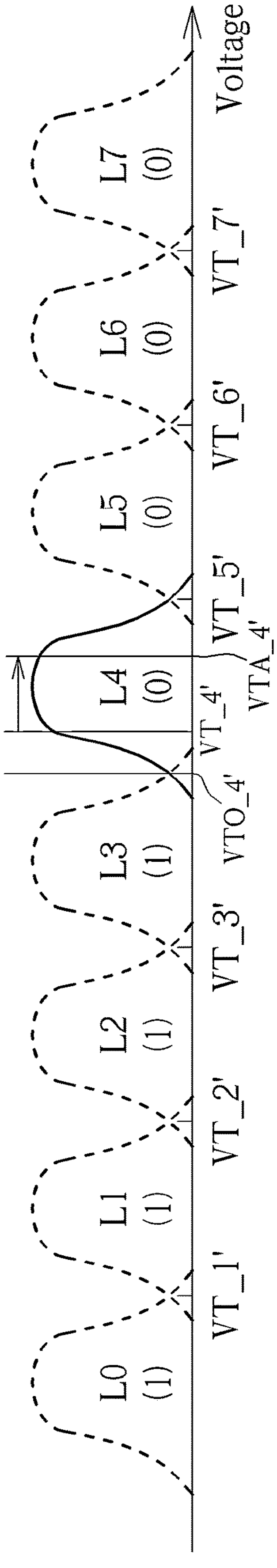
FIG. 14 is a diagram illustrating a memory controller reading a flash memory according to an embodiment of the present invention.

Please refer to FIG. 14, which is a diagram illustrating a memory controller 1304 reading a flash memory 1302 according to an embodiment of the present invention. For example, FIG. 14 shows the operation of reading a soft bit (i.e., the soft information value) from a memory unit of the flash memory 1302. According to the examples of the threshold voltage distribution shown in FIGS. 2 and 3, the memory unit of any one of the electric charge levels L0-L3 will store LSB=1, and the memory unit of any one of the electric charge levels L4-L7 will store LSB=0. Take the memory unit M_0 shown in FIG. 13 as an example. Assuming that the bit stored in the memory unit M_0 is (1, 0, 0), i.e. (MSB, CSB, LSB)=(1, 0, 0), when the memory controller 1304 utilizes the threshold voltage VT_4' to read the LSB of the memory unit M_0, the value read by the receiving circuit 13044 will be bit "0". In other words, the electric charge distributions stored in the memory unit M_0 is the electric charge level L4 as shown in FIG. 14. Please note that in FIG. 14, the solid-line curve represents the electric charge distribution of the electric charge level L4 in the memory unit M_0, and the dotted-line curves represent the reference locations of the electric charge distributions of the electric charge levels L0-L2 and L4-L7, which are not the actual electric charge distributions in the memory unit M_0.

However, when the adjusting unit 13042*c* of the memory controller 1304 adjusts the threshold voltage VT_4' as an adjusted threshold voltage VTA_4', and utilizes the adjusted threshold voltage VTA_4' to read the LSB of the memory unit M_0, the value read by the receiving circuit 13044 may be changed to bit "1" from bit "0". Specifically, considering a case where the threshold voltage VT_4' previously adopted by the memory controller 1304 is far from the best threshold voltage VTO_4', when the threshold voltage VT_4' is adjusted as the adjusted threshold voltage VTA_4', the adjusted threshold voltage VTA_4' may not be able to read the electric charges stored in the memory unit M_0 as shown in FIG. 14. In other words, when the threshold voltage VT_4' is adjusted as the adjusted threshold voltage VTA 4', the drift conditions of the electric charges in the memory unit M_0 may be obtained by variation of the bit value read by the receiving circuit 13044. Hence, in order to determine an electric charge distribution parameter from the plurality of memory units M_0-M_K, the memory controller 1304 in this embodiment will adjust the predetermined voltage combination option to generate an adjusted gate voltage combination, and then utilize the adjusted gate voltage combination to control the plurality of memory units M_0-M_K in the flash memory 1302. Next, the comparison unit 13046*a* of the data processing circuit 13046 compares the plurality of bit sequences BS_0, BS_1, BS_K with the plurality of adjusted bit sequences BSA_0, BSA_1, . . . , BSA_K received by the receiving circuit 13044 to thereby determines a bit value variation amount. Then, the setting unit 13046*b* sets the bit value variation amount as the electric charge distribution parameter. In other words, if the number of bit values changed (i.e., from 0 to 1 or from 1 to 0) between the plurality of bit sequences BS_0, BS_1, . . . , BS_K and the plurality of adjusted bit sequences BSA_0, BSA_1, . . . , BSA_K increases, it means that the drift condition of the electric charges in the plurality of memory units M_0-M_K becomes more severe, and vice versa. Hence, compared with the memory system 100 shown in the first embodiment, the plurality of electric charge distribution parameters A_1-A_N stored in the first column of the second LUT 13041*b* of the memory system 1300 shown in this embodiment are a plurality of different bit value variation amounts, rather than a plurality of syndrome-weights.

Figure 15:
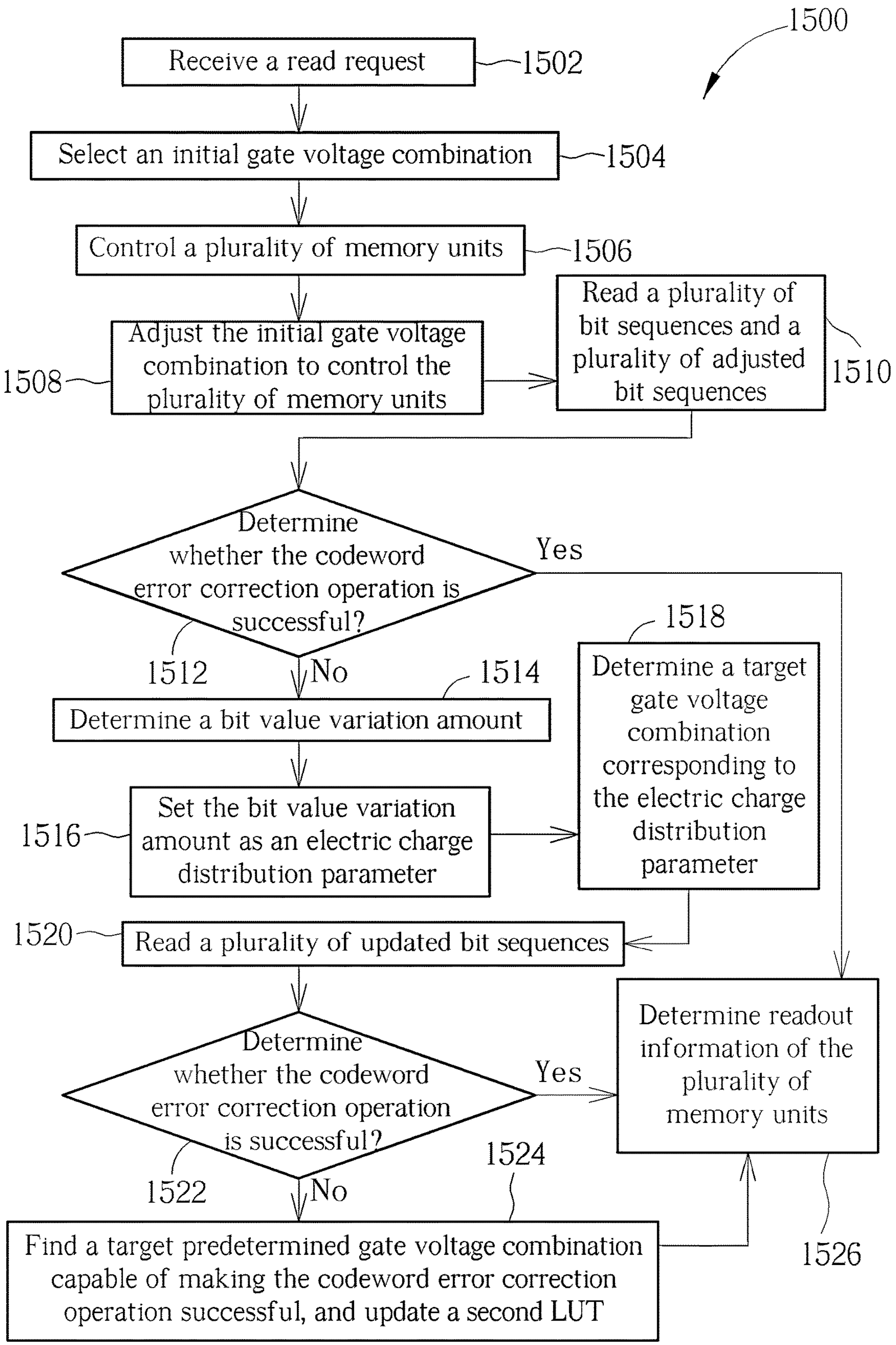
FIG. 15 is a flowchart illustrating another method of using a memory controller to read data stored in a flash memory according to an embodiment of the present invention.

Please refer to FIG. 15, which is a flowchart illustrating a method 1500 of using a memory controller 1304 to read data stored in a flash memory 1302 according to an embodiment of the present invention. If the result is substantially the same, the steps are not required to be continuously executed in the exact order shown in FIG. 15. That is, other steps can be exerted therein. The exemplary method 1500 shown in FIG. 15 may be briefly summarized as follows.

Step 1502: The memory controller 1304 receives a read request.

Step 1504: Utilize the control logic circuit 13042 to select an initial gate voltage combination OP_ini from a plurality of predetermined voltage combination options OP_1-OP_M.

Step 1506: Utilize the control logic circuit 13042 to control the plurality of memory units M_0-M_K of the target physical page (i.e., P_0) according to threshold voltages (i.e., [VT1_1:VT1_7]) corresponding to the initial gate voltage combination OP_ini in the first LUT 13041*a*.

Step 1508: Utilize an adjusting unit 13042*c* to adjust the initial gate voltage combination OP_ini, to generate an adjusted gate voltage combination OPA_ini to control the plurality of memory units M_0-M_K of the target physical page (e.g., P_0) in the flash memory 1302.

Step 1510: Utilize the receiving circuit 13044 to read a plurality of bit sequences BS_0, BS_1, . . . , BS_K and a plurality of adjusted bit sequences BSA 0, BSA 1, . . . , BSA_K.

Step 1512: Utilize the data processing circuit 13046 to perform a codeword error correction operation upon the plurality of bit sequences BS_0, BS_1, . . . , BS_K, and determine whether the codeword error correction operation is successful. If yes, go to step 1526; otherwise, go to step 1514.

Step 1514: Utilize a comparison unit 13046*a* to determine a bit value variation amount between the plurality of bit sequences BS_0, BS_1, . . . , BS_K and the plurality of adjusted BSA_0, BSA_1, . . . , BSA_K.

Step 1516: Utilize a setting unit 13046*b* to set the bit value variation amount as an electric charge distribution parameter A_1 of the initial gate voltage combination OP_ini.

Step 1518: Utilize a control logic circuit 13042 to determine a target gate voltage combination OP_tar1 (e.g., the target gate voltage combination OP_tar1 may be OP_2) corresponding to the electric charge distribution parameter A_1 according to a second LUT 13041*b*.

Step 1520: Utilize the control logic circuit 13042 to control a plurality of memory units M_0-M_K of the target physical page according to the target gate voltage combination OP_tar1, to read a plurality of updated bit sequences BSU_0, BSU_1, . . . , BSU_K.

Step 1522: Utilize a data processing circuit 13046 to perform the codeword error correction operation upon the plurality of updated bit sequences BSU_0, BSU_1, . . . , BSU_K, and determine whether the codeword error correction operation is successful. If yes, go to step 1526; otherwise, go to step 1524.

Step 1524: Utilize the control logic circuit 13042 to sequentially utilize other gate voltage combinations, other than the initial gate voltage combination OP_ini and target gate voltage combination OP_tar1 in the plurality of predetermined voltage combination options OP_1-OP_M, to control the plurality of memory units M_0-M_K in the flash memory 1302 to find a target predetermined gate voltage combination capable of making the codeword error correction operation successful, and update the original target gate voltage combination OP_tar1 in the second LUT 13041*b*. Go to Step 1526.

Step 1526: Utilize a data processing circuit 13046 to determine readout information of the plurality of memory units M_0-M_K of the target physical page.

Please note that, for brevity, the memory system 1300 in this embodiment does not depict the internal structure of the storage unit 13041. Since the first LUT 13041*a* and the second LUT 13041*b* in the storage unit 13041 of the memory system 1300 are similar to the first LUT 1041*a* and the second LUT 1041*b* of the storage unit 1041 shown in FIG. 4, respectively, the storage unit 1041 shown in FIG. 4 may also be used to realize the storage unit 13041 of the memory system 1300. Regarding the technical features related to the memory system 1300, the functions of the first LUT 13041*a* and the second LUT 13041*b* of the storage unit 13041 may be referred to that of the first LUT 1041*a* and the second LUT 1041*b* of the storage unit 1041, respectively.

Further, the difference between the memory system 1300 shown in this embodiment and the memory system 100 shown in the first embodiment is that, the plurality of electric charge distribution parameters A_1-A_N stored in the first column of the second LUT 13041*b* of the memory system 1300 are a plurality of different bit value variation amounts, rather than a plurality of syndrome-weights. The operation procedures of the memory systems 1300 and 100 are basically the same except the technical features for determining the plurality of electric charge distribution parameters A_1-A_N. Hence, the method for automatically updating an original target gate voltage combination corresponding to an electric charge distribution parameter in the second LUT 1041*b* as taught in FIG. 6 may be applied to the memory system 1300. Since one skilled should realize the corresponding operation procedures, further descriptions are omitted here for brevity.

Similarly, when the flash memory 1302 and the memory controller 1304 are just manufactured, the content of the second LUT 13041*b* is empty. Hence, the method for establishing a target gate voltage combination corresponding to an electric charge distribution parameter in the second LUT 1041*b* as taught in FIG. 7 may be applied to the memory system 1300. Since one skilled should realize the corresponding operation procedures, further descriptions are omitted here for brevity.

Hence, according to the memory system 1300 of this embodiment, when the codeword error correction operation is not successful, the memory controller 1304 will control the plurality of memory units M_0-M_K to generate the plurality of bit sequences BS_0, BS_1, . . . , BS_K and the plurality of adjusted bit sequences BSA_0, BSA_1, . . . , BSA_K, obtain a bit value variation amount between the plurality of memory units M_0-M_K to generate the plurality of bit sequences BS_0, BS_1, . . . , BS_K and the plurality of adjusted bit sequences BSA_0, BSA_1, . . . , BSA_K, and directly obtain the target gate voltage combination OP_tar1 corresponding to the bit value variation amount in the second LUT 13041 to control the plurality of memory units M_0-M_K.

In summary, when the codeword error correction operation is not successful, the embodiments provided by the present invention (i.e., the memory systems 100, 800 and 1300) first determine an electric charge distribution parameter (i.e., a syndrome-weight, soft information or a bit value variation amount) in the flash memory which is going to be read, and then directly utilize an LUT (i.e., the aforementioned second LUT) to find a target gate voltage combination corresponding to the electric charge distribution parameter, to control the flash memory. In this way, when the codeword error correction operation is not successful, the memory controller of the present invention may obtain a correct gate voltage combination more quickly to control the flash memory, without the need of wasting time on individually testing each of the predetermined gate voltage combinations to find the correct gate voltage combination.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a flash memory, comprising:

using an initial gate voltage combination to read the flash memory to obtain first bit sequences;

decoding the first bit sequences read from the flash memory;

determining an electric charge distribution parameter corresponding to the initial gate voltage combination according to decoded information of the first bit sequences;

determining a target gate voltage combination corresponding to the electric charge distribution parameter according a look-up table (LUT), wherein the target gate voltage combination comprises a plurality of threshold voltages;

using the target gate voltage combination to read the flash memory to obtain second bit sequences; and decoding the second bit sequences to determine readout information of the flash memory.

2. The method of claim 1, wherein the electric charge distribution parameter corresponding to the initial gate voltage combination is a syndrome-weight after the first bit sequences is decoded.

3. The method of claim 1, wherein the electric charge distribution parameter corresponding to the initial gate voltage combination is a bit value variation amount.

4. A memory controller, comprising:

a receiving circuit, for using an initial gate voltage combination to read a flash memory to obtain first bit sequences; and a control logic circuit, configured to decode the first bit sequences read from the flash memory, determine an electric charge distribution parameter corresponding to the initial gate voltage combination according to decoded information of the first bit sequences, and determine a target gate voltage combination corresponding to the electric charge distribution parameter according a look-up table (LUT), wherein the target gate voltage combination comprises a plurality of threshold voltages; and the control logic circuit is further configured to use the target gate voltage combination to read the flash memory to obtain second bit sequences, and decode the second bit sequences to determine readout information of the flash memory.

5. The memory controller of claim 4, wherein the electric charge distribution parameter corresponding to the initial gate voltage combination is a syndrome-weight after the first bit sequences is decoded.

6. The memory controller of claim 4, wherein the electric charge distribution parameter corresponding to the initial gate voltage combination is a bit value variation amount.

* * * * *